United States Patent
Kwon et al.

(10) Patent No.: US 9,183,932 B1
(45) Date of Patent: Nov. 10, 2015

(54) RESISTIVE MEMORY DEVICE AND METHOD OF OPERATING THE SAME

(71) Applicant: SAMSUNG ELECTRONICS CO., LTD., Suwon-si, Gyeonggi-do (KR)

(72) Inventors: Hyo-Jin Kwon, Seoul (KR); Yeong-Taek Lee, Seoul (KR); Dae-Seok Byeon, Seongnam-Si (KR); Yong-Kyu Lee, Hwaseong-Si (KR); Hyun-Kook Park, Anyang-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/685,671

(22) Filed: Apr. 14, 2015

(30) Foreign Application Priority Data

Jul. 15, 2014 (KR) ........................ 10-2014-0089274

(51) Int. Cl.
  *G11C 11/00* (2006.01)
  *G11C 13/00* (2006.01)

(52) U.S. Cl.
  CPC .......... *G11C 13/0069* (2013.01); *G11C 13/004* (2013.01); *G11C 13/0097* (2013.01)

(58) Field of Classification Search
  CPC .................................................... G11C 11/00
  USPC ............. 365/46, 94, 100, 129, 148, 158, 163;
        257/2–5, 9, 295, 310, E21.35; 438/95,
        438/96, 135, 166, 240, 365, 482, 486, 597,
        438/785
  See application file for complete search history.

(56) References Cited

U.S. PATENT DOCUMENTS

| | | | |
|---|---|---|---|
| 7,304,888 B2 | 12/2007 | Knall | |
| 7,411,811 B2 | 8/2008 | Inoue | |
| 7,697,317 B2 | 4/2010 | Shimaoka et al. | |
| 7,835,174 B2 | 11/2010 | Tokiwa | |
| 7,978,495 B2 | 7/2011 | Kawazoe et al. | |
| 8,350,299 B2 | 1/2013 | Yang et al. | |
| 8,654,564 B2 | 2/2014 | Kwak et al. | |
| 2008/0291715 A1* | 11/2008 | Park et al. ...................... 365/148 |
| 2010/0027326 A1* | 2/2010 | Kim et al. ...................... 365/163 |
| 2010/0103726 A1* | 4/2010 | Bae et al. ........................ 365/163 |
| 2010/0214837 A1* | 8/2010 | Sako et al. ............... 365/185.03 |
| 2012/0033489 A1* | 2/2012 | Song et al. ..................... 365/163 |
| 2012/0243294 A1 | 9/2012 | Kaneko et al. | |
| 2013/0077384 A1 | 3/2013 | Azuma et al. | |
| 2013/0250650 A1 | 9/2013 | Sasaki | |

* cited by examiner

*Primary Examiner* — Harry W Byrne
(74) *Attorney, Agent, or Firm* — Volentine & Whitt, PLLC

(57) ABSTRACT

A resistive memory device including multiple resistive memory cells arranged in regions where first signal lines and second signal lines cross each other, and a method of operating the resistive memory device, are provided. The method includes applying a first voltage to a first line, from among unselected first signal lines connected to unselected memory cells, that is not adjacent to a selected first signal line connected to a selected memory cell from among the multiple memory cells; applying a second voltage that is lower than the first voltage to a second line, from among the unselected first signal lines, that is adjacent to the selected first signal line; floating the unselected first signal lines; and applying a third voltage that is higher than the first voltage to the selected first signal line.

20 Claims, 21 Drawing Sheets

RESISTIVE MEMORY DEVICE AND METHOD OF OPERATING THE SAME

CROSS-REFERENCE TO RELATED APPLICATIONS

A claim for priority under 35 U.S.C. §119 is made to Korean Patent Application No. 10-2014-0089274, filed on Jul. 15, 2014, in the Korean Intellectual Property Office, the entire contents of which are hereby incorporated by reference.

BACKGROUND

Embodiments of the inventive concept relate to a memory device, and more particularly, to a resistive memory device and a method of operating the resistive memory device.

In response to demand for higher capacity and lower power consumption of memory devices, research in next-generation memory devices that are non-volatile and that do not require refresh operations is being conducted. The next-generation memory devices are required to have a high integrity characteristic of Dynamic Random Access Memory (DRAM), non-volatile characteristic of flash memory, and high speed static RAM (SRAM). Among the next-generation memory devices, Phase-change RAM (PRAM), Nano Floating Gate Memory (NFGM), Polymer RAM (PoRAM), Magnetic RAM (MRAM), Ferroelectric RAM (FeRAM), and Resistive RAM (RRAM) are highlighted.

SUMMARY

Embodiments of the inventive concept provide a method of operating a memory device for minimizing leakage current flowing in an unselected memory cell during writing or reading operations.

Embodiments of the inventive concept provide a memory device capable of minimizing leakage current flowing in an unselected memory cell during writing or reading operations.

According to an aspect of the inventive concept, there is provided a method of operating a resistive memory device, including multiple memory cells arranged in regions where multiple first signal lines and multiple second signal lines cross each other. The method includes applying a first voltage to a first line, from among unselected first signal lines connected to unselected memory cells, that is not adjacent to a selected first signal line connected to a selected memory cell from among the plurality of memory cells; applying a second voltage that is lower than the first voltage to a second line, from among the unselected first signal lines, that is adjacent to the selected first signal line; floating the unselected first signal lines; and applying a third voltage that is higher than the first voltage to the selected first signal line.

When the third voltage is applied to the selected first signal line, a voltage level of the second line from among the unselected first signal lines may change from the second voltage to the first voltage.

A voltage difference between the first voltage and the second voltage may be determined based on a voltage difference between the first voltage and the third voltage. A voltage difference between the first voltage and the second voltage may be set according to a kind of operation performed by the memory device.

The third voltage may be one of a reset writing voltage, a set writing voltage, and a reading voltage.

Floating the unselected first signal lines may include floating the first line after applying the first voltage to the first line; and floating the second line after applying the second voltage to the second line.

A time period of applying the first voltage may at least partially overlaps with a time period of applying the second voltage.

The method of operating a resistive memory device may further include applying a fourth voltage that is equal to or higher than the first voltage to a first line, from among unselected second signal lines that are connected to the unselected memory cells, that is not adjacent to a selected second signal line connected to the selected memory cell; applying a fifth voltage that is higher than the fourth voltage to a second line, from among the unselected second signal lines, that is adjacent to the selected second signal line; floating the unselected second signal lines; and applying a sixth voltage that is lower than the fourth voltage to the selected second signal line. The sixth voltage may be substantially the same as a ground voltage.

The resistive memory device may include multiple memory layers stacked in a first direction. Each of the memory layers may include multiple memory cells arranged between the multiple first signal lines arranged in a second direction that is perpendicular to the first direction and the multiple second signal lines arranged in a third direction that is perpendicular to the first and second directions. The second line from among the unselected first signal lines may include at least one unselected first signal line adjacent to the selected first signal line in the first and second directions. Each of the multiple memory layers may share the first signal lines or the second signal lines with other adjacent memory layers.

According to another aspect of the inventive concept, there is provided a method of operating a resistive memory device including multiple memory cells. The method includes applying a first voltage to an unselected signal line that is not adjacent to a selected signal line; applying a second voltage having a different voltage level from a voltage level of the first voltage to a unselected signal line that is adjacent to the selected signal line; and applying a third voltage having a different voltage level from the voltage levels of the first voltage and the second voltage, respectively, to the selected signal line. A voltage difference between the first voltage and the second voltage varies depending on an operation performed by the resistive memory device.

A voltage difference between the first voltage and the second voltage may be less than a voltage difference between the first voltage and the third voltage.

The third voltage may be one of a set writing voltage, a reset writing voltage, and a reading voltage, and the second voltage may be lower than the first voltage. Or, the third voltage may be substantially the same as a ground voltage and the second voltage may be higher than the first voltage.

According to another aspect of the inventive concept, there is provided a resistive memory device, including a memory cell array, a voltage generator and control logic. The memory cell array includes multiple memory cells arranged in regions where multiple first signal lines and multiple second signal lines cross each other. The voltage generator is configured to generate a first voltage, a second voltage different from the first voltage, and a third voltage different from the first and second voltages. The control logic is configured to select a memory cell from among the multiple memory cells, the selected memory cell being connected to a selected first signal line and a selected second signal line; to apply the first voltage to a first line, from among unselected first signal lines connected to unselected memory cells, that is not adjacent to the selected first signal line; to apply the second voltage to a second line, from among the unselected first signal lines, that is adjacent to the selected first signal line; and to apply the third voltage to the selected first signal line as the first and second lines are floated.

The third voltage may be higher than the first voltage, and the second voltage may lower than the first voltage for minimizing leakage current flowing in an unselected memory cell connected to the second line. The third voltage may be lower than the first voltage, and the second voltage may be higher than the first voltage for minimizing leakage current flowing in an unselected memory cell connected to the second line.

The voltage generator may be further configured to generate a fourth voltage, a fifth voltage different from the fourth voltage, and a sixth voltage different from the fourth and fifth voltages. The control logic may be further configured to apply the fourth voltage to a first line, from among unselected second signal lines connected to the unselected memory cells, that is not adjacent to the selected second signal line; to apply the fifth voltage to a second line, from among the unselected second signal lines, that is adjacent to the selected second signal line; and to apply the sixth voltage to the selected second signal line as the first and second lines are floated.

The fourth voltage may be equal to or higher than the first voltage, the fifth voltage may be higher than the fourth voltage, and the sixth voltage may be lower than the fourth voltage.

BRIEF DESCRIPTION OF THE DRAWINGS

Exemplary embodiments of the inventive concept will be more clearly understood from the following description taken in conjunction with the accompanying drawings, in which.

DETAILED DESCRIPTION OF THE EMBODIMENTS

Figure 1:
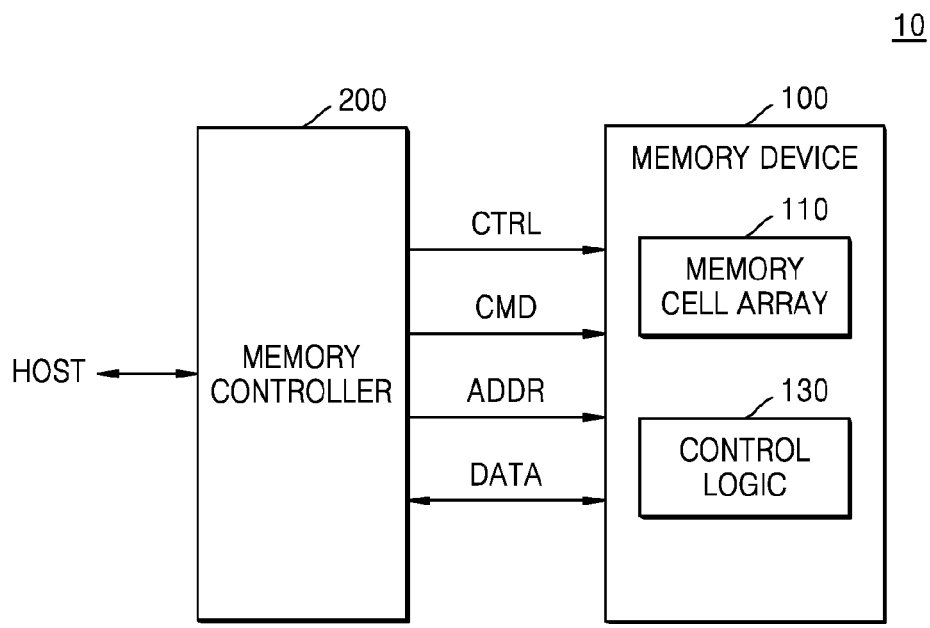
FIG. 1 is a block diagram of a memory system including a resistive memory device, according to an embodiment of the inventive concept.

Embodiments will be described in detail with reference to the following description and accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to one of ordinary skill in the art. Accordingly, known processes, elements, and techniques are not described with respect to some of the embodiments. Unless otherwise noted, like reference numerals denote like elements throughout the attached drawings and written description, and thus descriptions may not be repeated. In the drawings, sizes and dimensions of structures may be exaggerated for clarity.

Furthermore, all examples and conditional language recited herein are to be construed as being without limitation to such specifically recited examples and conditions. Throughout the specification, a singular form may include plural forms, unless there is a particular description contrary thereto. Also, terms such as "comprise" or "comprising" are used to specify existence of a recited form, a number, a process, an operation, a component, and/or groups thereof, not excluding the existence of one or more other recited forms, one or more other numbers, one or more other processes, one or more other operations, one or more other components and/or groups thereof.

While terms "first" and "second" are used to describe various components, it is obvious that the components are not limited to the terms "first" and "second". The terms "first" and "second" are used only to distinguish between each component. For example, a first component may indicate a second component or a second component may indicate a first component without conflicting with the inventive concept.

Unless expressly described otherwise, all terms including descriptive or technical terms which are used herein should be construed as having meanings that are apparent to one of ordinary skill in the art. Also, terms that are defined in a general dictionary and that are used in the following description should be construed as having meanings that are equivalent to meanings used in the related description, and unless expressly described otherwise herein, the terms should not be construed as being ideal or excessively formal.

As used herein, the term "and/or" includes any and all combinations of one or more of the associated listed items. Expressions such as "at least one of," when preceding a list of elements, modify the entire list of elements and do not modify the individual elements of the list. The term "exemplary" is intended to refer to an example or illustration.

FIG. 1 is a block diagram of a memory system including a resistive memory device, according to an embodiment of the inventive concept.

Referring to FIG. 1, a memory system 10 includes the resistive memory device 100 (hereinafter, referred as the memory device 100) and a memory controller 200. The memory device 100 includes a memory cell array 110 and control logic 130. In addition, the memory device 100 may further include circuits for performing writing and reading operations on the memory cell array 110 under control of the control logic 130. Since the memory cell array 110 includes resistive memory cells, the memory system 10 may be referred to as a resistive memory system.

In response to a write/read request from a host, the memory controller 200 may control the memory device 100 to read data stored in the memory device 100 and/or to write data to the memory device 100. In more detail, the memory controller 200 may provide an address ADDR, a command CMD, and a control signal CTRL to the memory device 100, and thus may control program (or write) operations, read operations, and erase operations with respect to the memory device 100. Also, data DATA to be written and data DATA to be read may be exchanged between the memory controller 200 and the memory device 100.

Although not illustrated, the memory controller 200 may include Random Access Memory (RAM), a processing unit, a host interface, and a memory interface. The RAM may be used as an operation memory of the processing unit. The processing unit may control operations of the memory controller 200. The host interface may include a protocol for enabling exchange of data between the host and the memory controller 200. For example, the memory controller 200 may communicate with an external source (i.e., the host) using at least one of various interface protocols, including universal serial bus (USB), multimedia card (MMC), Peripheral Component Interconnect Express (PCI-E), Advanced Technology Attachment (ATA), Serial-ATA, Parallel-ATA, Small Computer System Interface (SCSI), Enhanced Small Disk Interface (ESDI), and/or Integrated Drive Electronics (IDE).

The memory cell array 110 may include a plurality of memory cells (not shown) that are disposed respectively in regions where a plurality of first signal lines and a plurality of second signal lines cross each other, respectively. In the present embodiment, the first signal lines may be multiple bit lines, and the second signal lines may be multiple word lines. In another embodiment, the first signal lines may be multiple word lines, and the second signal lines may be multiple bit lines.

In the present embodiment, each of the memory cells may be a single level cell (SLC) that stores one bit data, or may be a multilevel cell (MLC) that stores at least two-bit data. Alternatively, the memory cell array 110 may include both the SLCs and the MLCs. When one bit data is written to one memory cell, the memory cells may have two resistance level distributions according to the written data. Alternatively, when two-bit data is written to one memory cell, the memory cells may have four resistance level distributions according to the written data. In another embodiment, if a memory cell is a triple level cell (TLC) that stores three-bit data, the memory cells may have eight resistance level distributions according to the written data. However, embodiments of the inventive concept are not limited thereto. Thus, in other embodiments, each of the memory cells may store at least four-bit data.

Also, in the present embodiment, the memory cell array 110 may include memory cells having a two-dimensional horizontal structure. In another embodiment, the memory cell array 110 may include memory cells with a three-dimensional vertical structure.

The memory cell array 110 may include resistance-type memory cells or resistive memory cells, each of which includes a variable resistor device (not shown) having a variable resistor. For example, when the resistance of the variable resistor device formed of a phase change material (e.g., Ge—Sb—Te) changes according to temperature, a resistive memory device may be Phase-change RAM (PRAM). As another example, when the variable resistor device is formed of complex metal oxide including an upper electrode, a lower electrode, and transition metal oxide therebetween, the resistive memory device is a Resistive RAM (RRAM). As another example, when the variable resistor device is formed of an upper electrode of a magnetic material, a lower electrode of the magnetic material, and a dielectric therebetween, the resistive memory device is a Magnetic RAM (MRAM).

In the present embodiment, when performing writing and reading operations on the memory cell array 110, different voltages are applied to selected signal lines connected to a selected memory cell from among multiple memory cells and unselected signal lines connected to unselected memory cells. An operating voltage or a voltage pulse for performing the writing operation or the reading operation is applied to the selected signal lines, and an inhibit voltage for blocking the leakage current is applied to the unselected signal lines. From among the unselected signal lines, inhibit voltages having different voltage levels may be applied to a first line(s), for example, at least one signal line not adjacent to the selected signal line (hereinafter, referred to as a "normal unselected signal line") and a second line(s), for example, an unselected signal line that is adjacent to the selected signal line (hereinafter, referred to as an "adjacent unselected signal line"). The adjacent unselected signal line may be coupled to the selected signal line, and the voltage level of the voltage applied to the adjacent unselected signal line may be changed in response to the operating voltage applied to the selected signal line. This may cause the leakage current in the unselected memory cell to increase. Therefore, a compensated inhibit voltage may be applied to the adjacent unselected signal line due to the above coupling.

For example, a first inhibit voltage may be applied to the normal unselected signal line, and a second inhibit voltage, which is greater or less than the first inhibit voltage, may be applied to the adjacent unselected signal line. If the operating voltage applied to the selected signal line is greater than the first inhibit voltage, the second inhibit voltage is less than the first inhibit voltage. If the operating voltage applied to the selected signal line is less than the first inhibit voltage, the second inhibit voltage is greater than the first inhibit voltage.

According to various embodiments, after applying the first inhibit voltage to the normal unselected signal line and the second inhibit voltage to the adjacent unselected signal line, the normal unselected signal line and the adjacent unselected signal line are floated. After that, the operating voltage or the voltage pulse is applied to the selected signal line. Due to the coupling to the selected signal line, the voltage level of the adjacent unselected signal line may be equal to or similar to the first inhibit voltage.

The control logic 130 controls overall operations of the memory device 100, as well as other circuits for performing memory operations, such as writing and reading operations.

The control logic 130 controls voltage levels of the voltages applied to the signal lines of the memory cell array 110 (for example, inhibit voltages applied to the unselected signal lines, and operating voltage or writing pulses applied to the selected signal lines), timing of applying the voltages, and differences between the applied voltages.

In addition, the memory controller 200 and the memory device 100 may be integrated as one semiconductor device. For example, the memory controller 200 and the memory device 100 may be integrated as one semiconductor device forming a memory card. For example, the memory controller 200 and the memory device 100 may be integrated into the semiconductor device, and thus may configure a personal computer (PC) card (a PCMCIA card), a compact flash card (CF card), a smart media card (SM/SMC), a memory stick, a multimedia card (MMC, RS-MMC, or MMCmicroO, an SD card (SD, miniSD, or microSD), or a universal flash storage (UFS). As another example, the memory controller 200 and the memory device 100 may be integrated into the semiconductor device, and thus may form a Solid State Disk/Drive (SSD).

An operation of the memory device 100 included in the resistive memory system 10 with the aforementioned structure will be described below with reference to FIG. 2.

Figure 2:
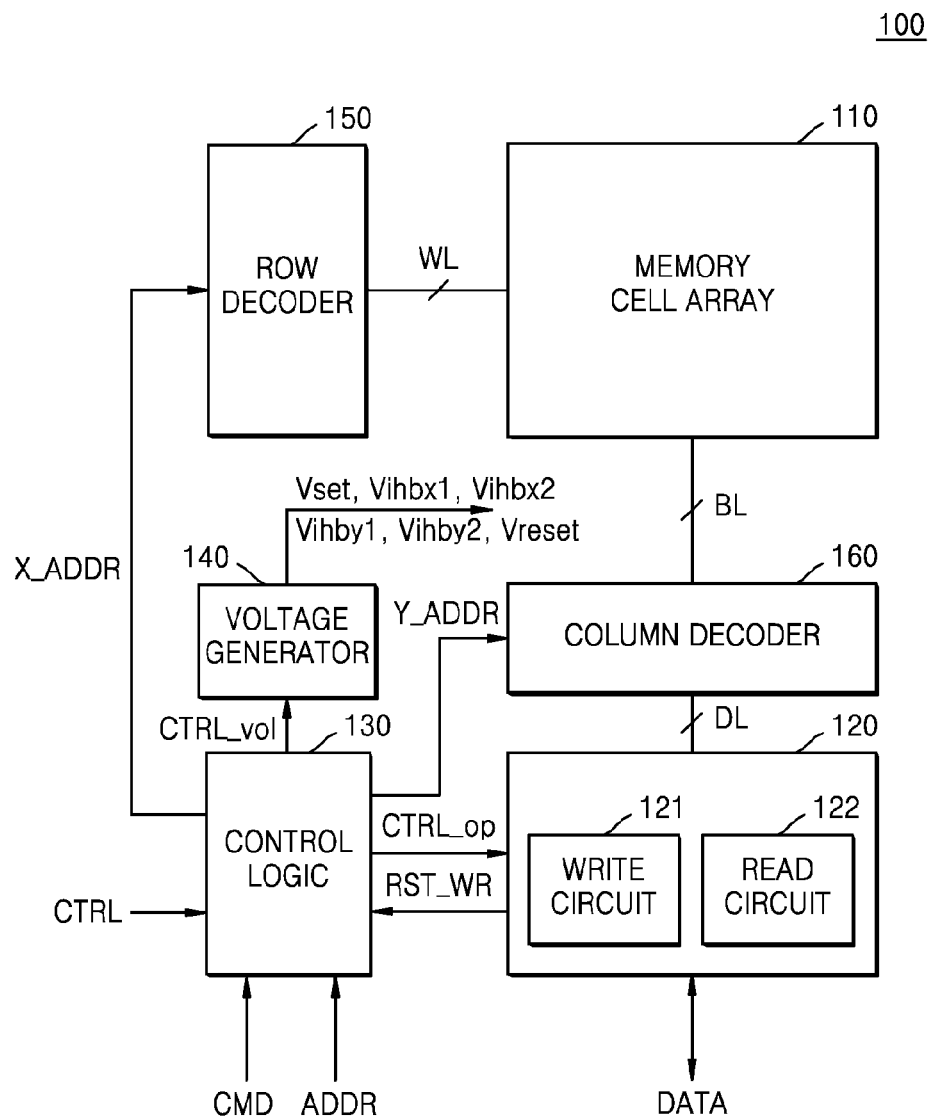
FIG. 2 is a block diagram of the memory device, according to an embodiment of the inventive concept.

FIG. 2 is a block diagram of the memory device 100 of FIG. 1, according to an embodiment of the inventive concept.

Referring to FIG. 2, the memory device 100 includes the memory cell array 110, a write/read circuit 120, the control logic 130, and a voltage generator 140. In addition, the memory device 100 further includes a row decoder 150 and a column decoder 160. The write/read circuit 120 includes a write circuit 121 and a read circuit 122.

The memory cell array 110 is connected to multiple first signal lines and multiple second signal lines. Also, the memory cell array 110 includes a plurality of memory cells that are respectively arranged in region where the first signal lines and the second signal lines cross each other. Hereinafter, it is assumed that the first signal lines are bit lines BL, and the second signal lines are word lines WL.

An address ADDR for indicating a memory cell that is to be accessed is input. The address ADDR may include a row address X_ADDR for selecting a word line of the memory cell array 110 and a column address Y_ADDR for selecting a bit line of the memory cell array 110. The row decoder 150 is connected to the memory cell array 110 via the word lines WL and may select at least one of the word lines WL in response to the row address X_ADDR. The row decoder 150 receives voltages from the voltage generator 140 and transfers the voltages to the word lines WL. For example, the row decoder 150 may provide the selected word line WL with a ground voltage or a reset writing voltage Vreset, and may provide the unselected word lines WL with row inhibit voltages, namely, first and second row inhibit voltages Vihbx1 and Vihbx2, for preventing leakage current. However, various embodiments of the inventive concept are not limited thereto. The memory device 100 may include an additional switching block (not shown) and may provide inhibit voltages, for example, the first and second row inhibit voltages Vihbx1 and Vihbx2, to the unselected word lines WL through the switching operation of the switching block.

According to the embodiment, the row decoder 150 provides unselected word lines WL with at least two row inhibit voltages, namely, first and second row inhibit voltages Vihbx1 and Vihbx2. The first row inhibit voltage Vihbx1 is provided to some of the unselected word lines WL, and the second row inhibit voltage Vihbx2 is provided to other unselected word lines WL. For example, the row decoder 150 may apply the first row inhibit voltage Vihbx1 to the first line, for example, the normal unselected word line, from among the unselected word lines WL, and may apply the second row inhibit voltage Vihbx2 to the second line, for example, the adjacent unselected word line WL.

In the present embodiment, the second row inhibit voltage Vihbx2 may be a compensated inhibit voltage that is obtained by compensating for the first row inhibit voltage Vihbx1 in consideration of the coupling between the unselected word line WL and the selected word line WL.

According to various embodiments of the inventive concept, the row decoder 150 applies the first row inhibit voltage Vihbx1 and the second row inhibit voltage Vihbx2 to the unselected word lines WL, and after that, may float the unselected word lines WL. After that, the row decoder 150 may apply the reset voltage Vreset or the ground voltage Vss to the selected word line WL. According to the present embodiment, the first and second row inhibit voltages Vihbx1 and Vihbx2 may be applied sequentially to corresponding unselected word lines WL. According to another embodiment, the first and second row inhibit voltages Vihbx1 and Vihbx2 may be applied simultaneously to the corresponding unselected word lines WL.

In addition, in another embodiment, the memory device 100 may include an additional switching block (not shown). The unselected word lines WL may be provided with the first and second row inhibit voltages Vihbx1 and Vihbx2 according to the switching operation of the switching block.

The column decoder 160 is connected to the memory cell array 110 via the bit lines BL and selects at least one of the bit lines BL in response to the column address Y_ADDR. The column decoder 160 may receive voltages from the voltage generator 14, and provide the voltages to the bit lines BL. Also, the column decoder 160 may receive write pulses, for example, voltage pulses or current pulses, from the write/read circuit 120 and provides the bit lines BL with the write pulses. For example, the column decoder 160 may provide the selected bit line BL with a set voltage Vset, a read voltage Vread, or the ground voltage Vss, and may provide the unselected bit lines BL with column inhibit voltages, namely, first and second column inhibit voltages Vihby1 and Vihby2, for preventing the leakage current.

In the present embodiment, the column decoder 160 may provide the unselected bit lines BL with at least two column inhibit voltages, namely, first and second column inhibit voltages Vihby1 and Vihby2. The first column inhibit voltage Vihby1 is provided to some of the unselected bit lines BL, and the second column inhibit voltage Vihby2 is provided to other unselected bit lines BL. For example, the column decoder 160 may apply the first column inhibit voltage Vihby1 to the first line, for example, the normal unselected bit line BL, from among the unselected bit lines BL, and may apply the second column inhibit voltage Vihby2 to the second lines, for example, the adjacent unselected bit line BL.

According to another embodiment, the second column inhibit voltage Vihby2 is an inhibit voltage obtained by compensating for the first column inhibit voltage Vihby1 in consideration of the coupling between the unselected bit line BL and the selected bit line BL.

According to various embodiments of the inventive concept, the column decoder 160 may apply the first and second column inhibit voltages Vihby1 and Vihby2 to the unselected bit lines BL, and then float the unselected bit lines BL. After that, the column decoder 160 may apply the set write voltage Vset, the read voltage Vread, or the ground voltage Vss to the selected bit line BL. As another embodiment, the column decoder 160 may receive the write pulses, for example, the voltage pulses or the current pulses from the write/read circuit 120, and may transfer the write pulses to the selected bit line BL.

According to the present embodiment, the first column inhibit voltage Vihby1 and the second column inhibit voltage Vihby2 may be sequentially applied to their corresponding unselected bit lines BL. According to another embodiment, the first and second column inhibit voltages Vihby1 and Vihby2 may be simultaneously applied to their corresponding unselected bit lines BL.

In another embodiment, the memory device 100 may include an additional switching block (not shown), and the first and second column inhibit voltages Vihby1 and Vihby2 may be provided to the unselected bit lines according to the switching operation of the switching block.

The write/read circuit 120 is connected to the bit line BL via the column decoder 160 to write data to a memory cell or to read data from the memory cell. The write/read circuit 120 writes data DATA input from the outside to the memory cell array 110, or reads the data in the memory cell array 110 to output the data to the outside, under control of the control logic 130. Also, the write/read circuit 120 may provide the control logic 130 with a writing or reading result RST_WR. For example, the write/read circuit 120 may perform a verification operation for detecting a result of the writing operation when performing the writing operation, and provide the control logic 130 with the verification result, for example, pass or fail information.

The write circuit 121 is connected to the selected bit line BL via the column decoder 160 and may provide the selected memory cell MC with a write current pulse or a write voltage pulse to perform the writing operation. As such, the data DATA to be stored is input to the memory cell array 110.

The read circuit 122 is connected to the selected bit line BL via the column decoder 160, and senses a resistor value of the selected memory cell MC to read the data DATA stored in the memory cell MC. As such, the data DATA stored in the memory cell array 110 is output.

The control logic 130 may output various control signals for writing the data DATA to the memory cell array 110 or for reading data DATA from the memory cell array 110, based on a command CMD, the address ADDR, and a control signal CTRL transmitted from the memory controller 200. The various control signals output from the control logic 130 may be provided to the write/read circuit 120, the voltage generator 140, the row decoder 150, and the column decoder 160, and accordingly, the control logic 130 may control overall operations of the memory device 100.

In particular, the control logic 130 may provide the write/read circuit 120 with various operation control signals CTRL_op. Also, the control logic 130 may provide the voltage generator 140 with a voltage control signal CTRL_vol. In the present embodiment, the control logic 130 generates the voltage control signal CTRL_vol so as to adjust levels of the voltages generated by the voltage generator 140 according to an operation mode (for example, a set writing operation, a reset writing operation, or a reading operation) performed in the memory cell array 110. In another embodiment, the control logic 130 generates the voltage control signal CTRL_vol so as to generate at least two row inhibit voltages, namely, first and second row inhibit voltages Vihbx1 and Vihbx2, and at least two column inhibit voltages, namely, first and second column inhibit voltages Vihby1 and Vihby2.

The control logic 130 may provide the row decoder 150 with the row address X_ADDR and may provide the column decoder 160 with the column address Y_ADDR. Also, the control logic 130 may provide the row decoder 150 and the column decoder 160 with signals indicating operation timings. Moreover, the control logic 130 may receive the result of the writing/reading operations (RST_WR) from the write/read circuit 120 and control the various operations of the memory device 100 with reference to the writing/reading operation results RST_WR.

The voltage generator 140 generates various voltages for performing the writing, reading, and erasing operations on the memory cell array 110 based on the voltage control signal CTRL_vol. The voltage generator 140 may generate voltages for driving the word lines WL and the bit lines BL. For example, the voltage generator 140 may generate a set write voltage Vset, a reset write voltage Vreset, the first and second row inhibit voltages Vihbx1 and Vihbx2, and the first and second column inhibit voltages Vihby1 and Vihby2. As an embodiment, the voltage generator 140 may generate at least two row inhibit voltages, namely, first and second row inhibit voltages Vihbx1 and Vihbx2, and at least two column inhibit voltages, namely, first and second column inhibit voltages Vihby1 and Vihby2.

Figure 3:
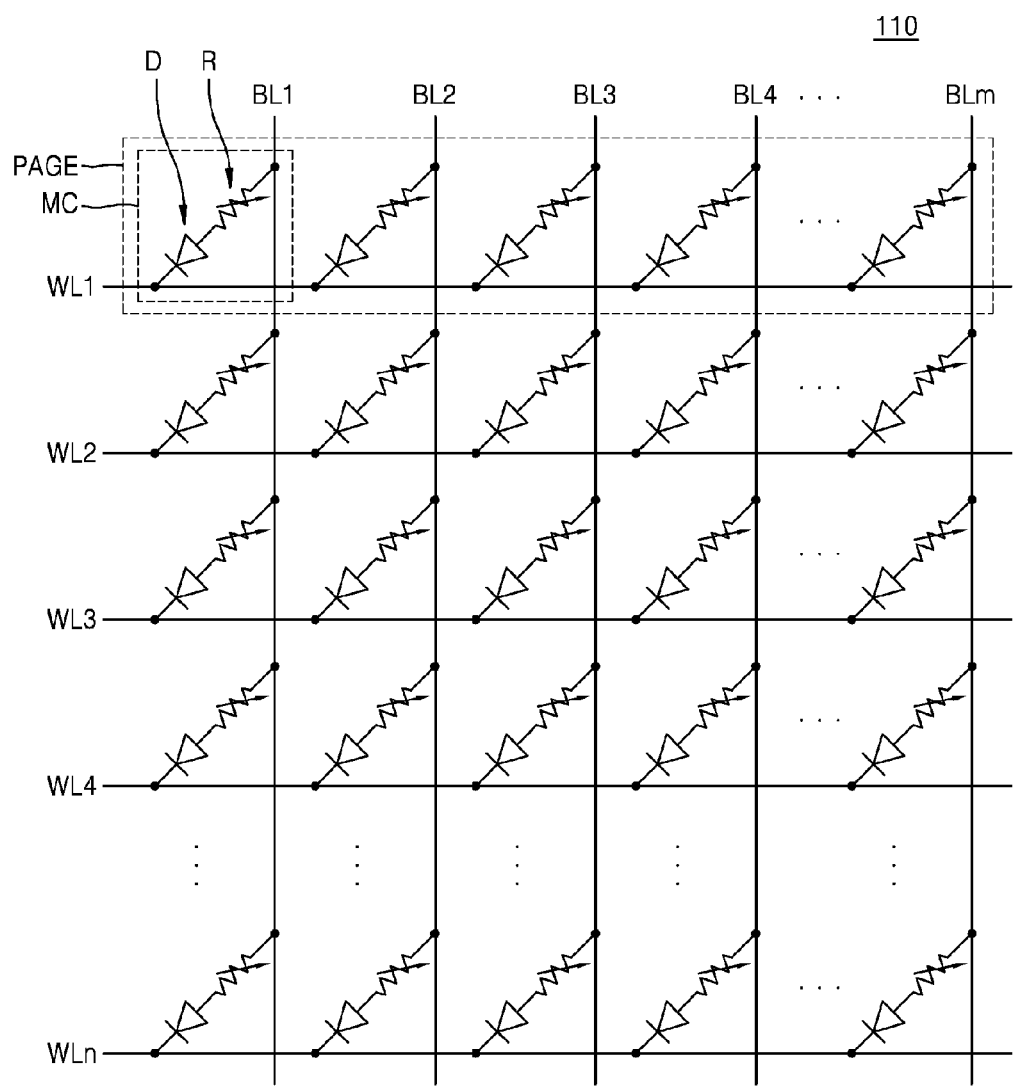
FIG. 3 is a circuit diagram of a memory cell array of FIG. 2.

FIG. 3 is a circuit diagram of the memory cell array 110 of FIG. 2, according to an embodiment of the inventive concept.

Referring to FIG. 3, the memory cell array 110 is a two-dimensional memory having a horizontal structure. However, various embodiments of the inventive concept are not limited thereto. That is, the memory cell array 110 may be a three-dimensional memory having a vertical structure, for example. The memory cell array 110 includes multiple word lines WL1 through WLn, multiple bit lines BL1 through BLm, and multiple memory cells MC. The number of word lines WL, the number of bit lines BL, and the number of memory cells MC may vary depending upon various embodiments of the inventive concept. Also, the memory cells MC selected by the same word line WL may be defined as a page PAGE unit.

According to the present embodiment, each of the memory cells MC may include a variable resistor device R and a selection device D. Here, the variable resistor device R may be referred to as a variable resistive material and the selection device D may be referred to as a switching device.

In an embodiment, the variable resistor device R may be connected between one of the bit lines BL1 through BLm and the selection device D, and the selection device D may be connected between the variable resistor device R and one of the word lines WL1 through WLn. However, various embodiments of the inventive concept are not limited thereto, and the selection device D may be connected between one of the bit lines BL1 through BLm and the variable resistor device R, and the variable resistor device R may be connected between the selection device D and one of the word lines WL1 through WLn.

In the present embodiment, the variable resistor device R may be switched to one of multiple resistive states, in response to an electric pulse applied thereto. The variable resistor device R may include a resistive material for storing data. The variable resistor device R may include a phase-change material, a crystal state of which changes according to current. The phase-change material may include various materials, such as GaSb, InSb, InSe, or $Sb_2Te_3$ obtained by compounding two elements, GeSbTe, GaSeTe, InSbTe, $SnSb_2Te_4$, or InSbGe obtained by compounding three elements, or AgInSbTe, (GeSn)SbTe, GeSb(SeTe), or $Te_{81}Ge_{15}Sb_2S_2$ obtained by compounding four elements, for example.

Generally, the phase-change material has an amorphous state that is relatively resistive, and a crystal state that is relatively low-resistive. A phase of the phase-change material may be changed by Joule's heat generated by current. Data is written using the changes of phase of the phase-change material.

In another embodiment, the variable resistor device R does not include phase-change material, but rather includes perovskite compounds, transition metal oxide, magnetic materials, ferromagnetic materials, or antiferromagnetic materials, for example.

The selection device D may be connected between one of the word lines WL1 through WLn and the variable resistor device R. According to a voltage applied to the connected word line and bit line, current that is supplied to the variable resistor device R is controlled. In FIG. 3, the selection device D is a diode, although various embodiments of the inventive concept are not limited thereto. That is, the selection device D may be another type of device that may be switched according to another embodiment.

Figure 4:
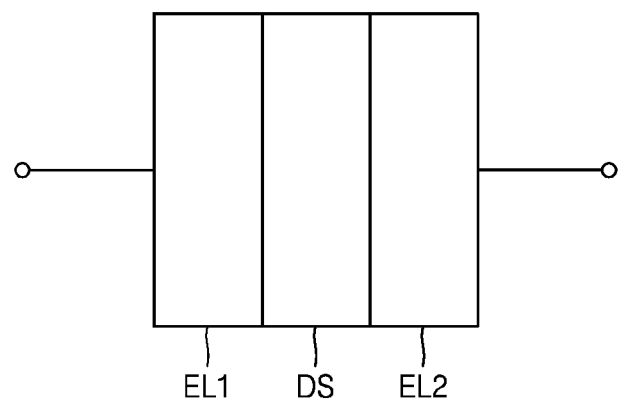
FIG. 4 is a diagram showing an example of a variable resistive device included in a memory cell of FIG. 3.

FIG. 4 is a diagram of the variable resistor device R included in the memory cell MC of FIG. 3.

Referring to FIG. 4, the variable resistor device R include a first electrode EL1, a second electrode EL2, and a data storage film DS disposed between the first and second electrodes EL1 and EL2.

The first and second electrodes EL1 and EL2 may be formed of various metal, metal oxide, or metal nitride material. For example, the first and second electrodes EL1 and EL2 may be formed of aluminum (Al), copper (Cu), titanium nitride (TiN), titanium aluminum nitride (TixAlyNz), iridium (Ir), platinum (Pt), silver (Ag), gold (Au), poly silicon, tungsten (W), titanium (Ti), tantalum (Ta), tantalum nitride (TaN), tungsten nitride (WN), nickel (Ni), cobalt (Co), chrome (Cr), antimony (Sb), iron (Fe), molybdenum (Mo), palladium (Pd), tin (Sn), zirconium (Zr), zinc (Zn), iridium oxide ($IrO_2$), and/or strontium zirconate oxide ($StZrO_3$).

The data storage film DS may be formed of a bipolar resistive memory material or a unipolar resistive memory material, for example. The bipolar resistive memory material may be programmed as a set state or a reset state according to a polarity of the pulse. The bipolar resistive memory material may include Perovskite-based materials, for example. In addition, the unipolar resistive memory material may be programmed as a set state or a reset state by a pulse of the same polarity. The unipolar resistive memory material may include transition metal oxide, such as NiOx or TiOx, for example.

FIGS. 5A through 5D are circuit diagrams of modified examples of the memory cell MC of FIG. 4.

Figure 5A:
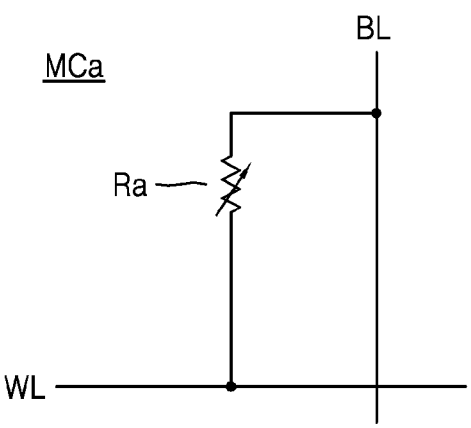
FIGS. 5A through 5C are circuit diagrams showing modified examples the memory cell of FIG. 4.

Referring to FIG. 5A, a memory cell MCa includes a variable resistor device Ra connected between a bit line BL and a word line WL. The memory cell MCa may store data due to voltages that are applied to the bit line BL and the word line WL, respectively.

Figure 5B:
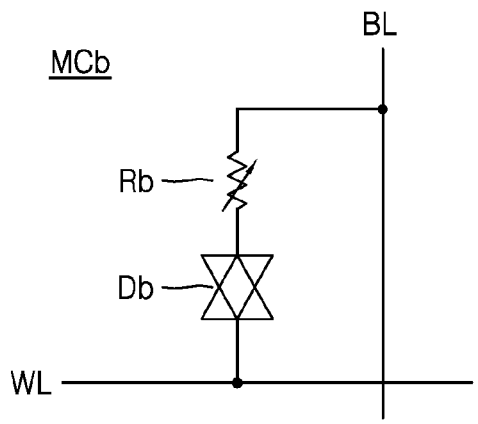

Referring to FIG. 5B, a memory cell MCb includes a variable resistor device Rb and a bidirectional diode Db. The variable resistor device Rb may include a resistive material to store data. The bidirectional diode Db is connected between the variable resistor device Rb and a word line WL, and the variable resistor device Rb is connected between a bit line BL and the bidirectional diode Db. Alternatively, the positions of the bidirectional diode Db and the variable resistor device Rb may be switched with each other. The bidirectional diode Db may cut leakage current that may flow in an unselected resistor cell.

Figure 5C:
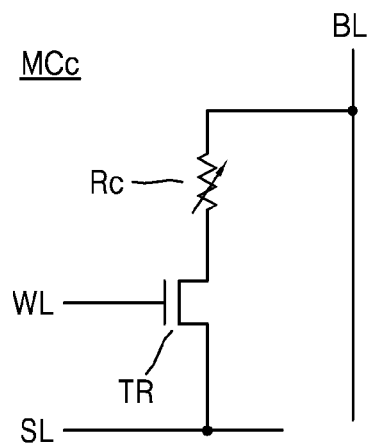

Referring to FIG. 5C, a memory cell MCc includes a variable resistor device Rc and a transistor TR. The transistor TR is a selection device, i.e., a switching device, that supplies or cuts a current to the variable resistor device Rc, according to a voltage of a word line WL. The transistor TR is connected between the variable resistor device Rc and the word line WL, and the variable resistor device Rc is connected between a bit line BL and the transistor TR. Alternatively, the positions of the transistor TR and the variable resistor device Rc may be switched with each other. The memory cell MCc may be selected or not be selected, according to ON or OFF state of the transistor TR, which is driven by the word line WL.

Figure 6:
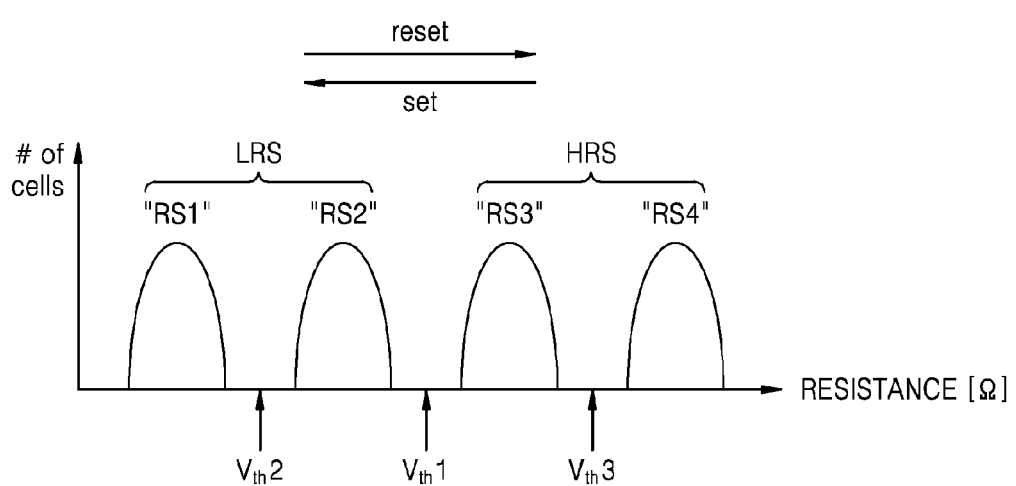
FIG. 6 is a graph of a distribution of memory cells according to resistance level, when the memory cell of FIG. 3 is a multi-level cell.

FIG. 6 is a graph illustrating a distribution of the memory cells MC according to resistances thereof, when the memory cell MC of FIG. 3 is a multi-level cell.

Referring to FIG. 6, a horizontal axis denotes resistance, and a vertical axis denotes the number of memory cells MC. For example, when the memory cell MC is a multi-level cell that is programmed with two bits, the memory cell MC may have one of a first resistance state RS1, a second resistance state RS2, a third resistance state RS3, and a fourth resistance state RS4.

However, various embodiments of the inventive concept are not limited thereto. For example, multiple memory cells may include triple level cells (TLCs) storing data of 3 bits, and accordingly, each of the memory cells may have one of eight resistance states. In another embodiment, the multiple memory cells may include memory cells, each storing data of 4 bits or greater.

Referring again to FIG. 6, when the memory cell MC is a multi-level cell (MLC) that is programmed with 2 bits, the memory cell MC may have four resistance states RS1, RS2, RS3 and RS4, as mentioned above, and the four resistance states RS1, RS2, RS3 and RS4 may be divided into two states, including a high resistance state HRS and a low resistance state LRS. When comparing with the SLC, the MLC has narrower intervals between resistance distributions, and thus reading errors may occur due to small changes in the resistance in the MLC. Therefore, resistance states RS1, RS2, RS3, and RS4 may respectively have resistor ranges that do not overlap with each other in order to provide a read margin.

In the present embodiment, a first threshold resistance level Vth1 may have a resistance level between the second resistance state RS2 and the third resistance state RS3. Here, the first resistance state RS1 and the second resistance state RS2, which are equal to or less than the first threshold resistance level Vth1, indicate the low resistance state LRS, and the third resistance state RS3 and the fourth resistance state RS4, which are greater than the first threshold resistance level Vth1, indicate the high resistance state HRS. Also, a second threshold resistance level Vth2 may have a resistance level between the first resistance state RS1 and the second resistance state RS2. According to the second threshold resistance level Vth2, it may be determined whether a memory cell MC among memory cells MC with the low resistance state LRS has the first resistance state RS1 or the second resistance state RS2. Also, a third threshold resistance level Vth3 may have a resistance level between the third resistance state RS3 and the fourth resistance state RS4. According to the third threshold resistance level Vth3, it may be determined whether a memory cell MC among memory cells MC with the high resistance state HRS has the third resistance state RS3 or the fourth resistance state RS4.

Each of the first, second, third, and fourth resistance states RS1, RS2, RS3, and RS4 may correspond to one of data '00', data '01', data '10', and data '11'. In the present embodiment, the resistance level R may increase in the order of data '11', data '01', data '00', and data '10'. That is, the first resistance state RS1 may correspond to data '11', the second resistance state RS2 may correspond to data '01', the third resistance state RS3 may correspond to data '00', and the fourth resistance state RS4 may correspond to data '10'.

An operation of applying a write pulse to the memory cell MC to switch the memory cell MC from the high resistance state HRS to the low resistance state LRS is referred to as a set operation or a set writing operation. Also, an operation of applying a write pulse to the memory cell MC to switch the memory cell from the low resistance state LRS to the high resistance state HRS is referred to as a reset operation or a reset writing operation.

Figure 7:
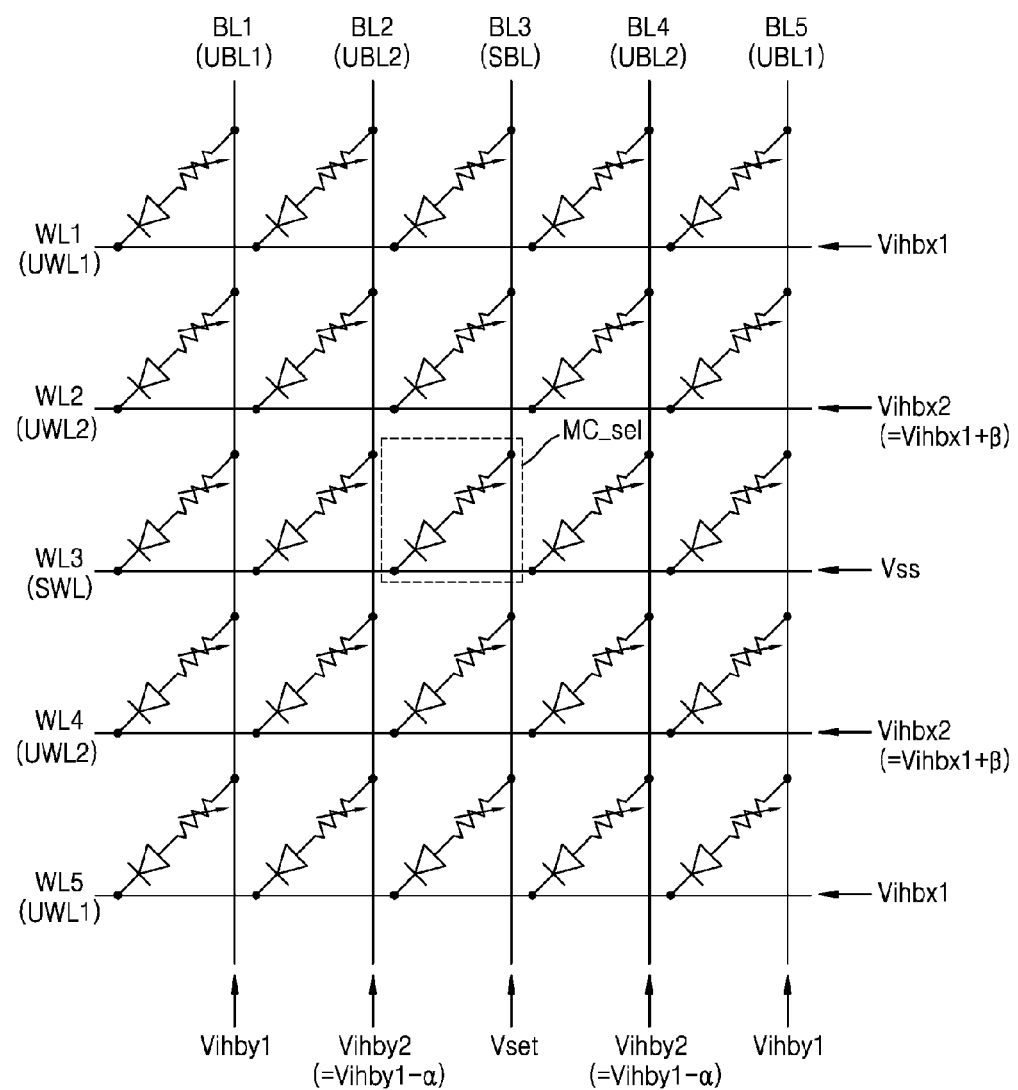
FIG. 7 is a circuit diagram showing voltages applied to signal lines in a set writing operation, according to an embodiment of the inventive concept.

FIG. 7 is a circuit diagram showing voltages applied to signal lines during a set writing operation, according to an embodiment of the inventive concept. For convenience of description, it is assumed that the memory cell array 110 includes first through fifth word lines WL1-WL5 and first through fifth bit lines BL1-BL5, and memory cells MC arranged in regions where the word lines WL1-WL5 and the bit lines BL1-BL5 cross each other, respectively.

Referring to the example shown in FIG. 7, the first, second, fourth, and fifth bit lines BL1, BL2, BL4, and BL5 are unselected bit lines connected to the memory cells MC that are not selected, and the third bit line BL3 is a selected bit line SBL connected to a selected memory cell MC_sel. From among the unselected bit lines BL1, BL2, BL4, and BL5, the second and fourth bit lines BL2 and BL4 adjacent to the selected bit line SBL are referred to as adjacent unselected bit lines UBL2, and the first and fifth bit lines BL1 and BL5 not adjacent to the selected bit line SBL are referred to as normal unselected bit lines UBL1.

Also, the first, second, fourth, and fifth word lines WL1, WL2, WL4, and WL5 are unselected word lines that are connected to unselected memory cells MC, and the third word line WL3 is a selected word line SWL that is connected to the selected memory cell MC_sel. From among the unselected word lines WL1, WL2, WL4, and WL5, the second and fourth word lines WL2 and WL4 adjacent to the selected word line SWL are referred to as adjacent unselected word lines UWL2, and the first and fifth word lines WL1 and WL5 not adjacent to the selected word line WBL are referred to as normal unselected word lines UWL1.

In the present embodiment, a first voltage, for example, a first column inhibit voltage Vihby1, is applied to the normal unselected bit lines UBL1, and a second voltage, for example, a second column inhibit voltage Vihby2, is applied to the adjacent unselected bit lines UBL2. In addition, a third voltage, for example, a set writing voltage Vset is applied to the selected bit line SBL. Hereinafter, it is assumed that the first voltage is the first column inhibit voltage Vihby1, the second voltage is the second column inhibit voltage Vihby2, and the third voltage is the set writing voltage Vset. The set writing voltage Vset may be higher than the first column inhibit voltage Vihby1, and the first column inhibit voltage Vihby1 may be higher than the second column inhibit voltage Vihby2. For example, the first column inhibit voltage Vihby1 may have a voltage level that is equal to or less than half the voltage level of the set writing voltage Vset. As another example, the first column inhibit voltage Vihby1 may be set in order to reduce leakage current flowing in the unselected memory cells MC during the set writing operation.

In various embodiments of the inventive concept, a difference α between the first column inhibit voltage Vihby1 and the second column inhibit voltage Vihby2 may be determined in consideration of a difference between the set writing voltage Vset and the first column inhibit voltage Vihby1. For example, the voltage difference α between the first column inhibit voltage Vihby1 and the second column inhibit voltage Vihby2 may be set to be less than the voltage difference between the set writing voltage Vset and the first column inhibit voltage Vihby1. As another example, when the voltage difference between the set writing voltage Vset and the first column inhibit voltage Vihby1 increases, the voltage difference α between the first column inhibit voltage Vihby1 and the second column inhibit voltage Vihby2 may be set to be larger. Otherwise, the voltage difference α between the first column inhibit voltage Vihby1 and the second column inhibit voltage Vihby2 may be set in advance according to an operation mode performed on the memory cell array 110. In the present embodiment, the voltage difference α according to the set writing operation may be set in advance.

In an embodiment, a fourth voltage, for example, a first row inhibit voltage Vihbx1, may be applied to the normal unselected word lines UWL1, and a fifth voltage, for example, a second row inhibit voltage Vihbx2, may be applied to the adjacent unselected word lines UWL2. In addition, a sixth voltage, for example, a ground voltage Vss, may be applied to the selected word line SWL. Hereinafter, it is assumed that the fourth voltage is the first row inhibit voltage Vihbx1, the fifth voltage is the second row inhibit voltage Vihbx2, and the sixth voltage is the ground voltage Vss. The first row inhibit voltage Vihbx1 may be higher than the ground voltage Vss and may be less than the second row inhibit voltage Vihbx2. For example, the first row inhibit voltage Vihbx1 may have a voltage level that is equal to or greater than half of the voltage level of the set writing voltage Vset. As another example, the first row inhibit voltage Vihbx1 may be set to minimize leakage current flowing in the unselected memory cells MCs. In the present embodiment, the voltage level of the first row inhibit voltage Vihbx1 may be equal to or greater than that of the first column inhibit voltage Vihby1.

In various embodiments of the inventive concept, a voltage difference β between the first row inhibit voltage Vihbx1 and the second row inhibit voltage Vihbx2 may be determined in consideration of a voltage difference between the ground voltage Vss and the first row inhibit voltage Vihbx1. As an example, the voltage difference β between the first row inhibit voltage Vihbx1 and the second row inhibit voltage Vihbx2 may be set to be less than the voltage difference between the ground voltage Vss and the first row inhibit voltage Vihbx1. As another example, when the voltage difference between the ground voltage Vss and the first row inhibit voltage Vihbx1 increases, the voltage difference β between the first row inhibit voltage Vihbx1 and the second row inhibit voltage Vihbx2 may be set to be larger. Otherwise, the voltage difference β between the first row inhibit voltage Vihbx1 and the second row inhibit voltage Vihbx2 may be set in advance according to an operation mode performed on the memory cell array 110. In the present embodiment, the voltage difference β according to the set writing operation may be set in advance.

In addition, according to the present embodiment, at least two column inhibit voltages, namely, first and second column inhibit voltages Vihby1 and Vihby2, are applied to the unselected bit lines BL1, BL2, BL4, and BL5, and at least two row inhibit voltages, namely, first and second row inhibit voltages Vihbx1 and Vihbx2, are applied to the unselected word lines WL1, WL2, WL4, and WL5. However, various embodiments of the inventive concept are not limited thereto. That is, in an embodiment, at least two column inhibit voltages, namely, first and second column inhibit voltages Vihby1 and Vihby2 may be applied to the unselected bit lines BL1, BL2, BL4, and BL5, and one row inhibit voltage, for example, the first row inhibit voltage Vihbx1, may be applied to the unselected word lines WL1, WL2, WL4, and WL5. In another embodiment, at least two row inhibit voltages, namely, first and second row inhibit voltages Vihbx1 and Vihbx2, may be applied to the unselected word lines WL1, WL2, WL4, and WL5, and one column inhibit voltage, for example, the first column inhibit voltage Vihby1, may be applied to the unselected bit lines BL1, BL2, BL4, and BL5.

Figure 8A:
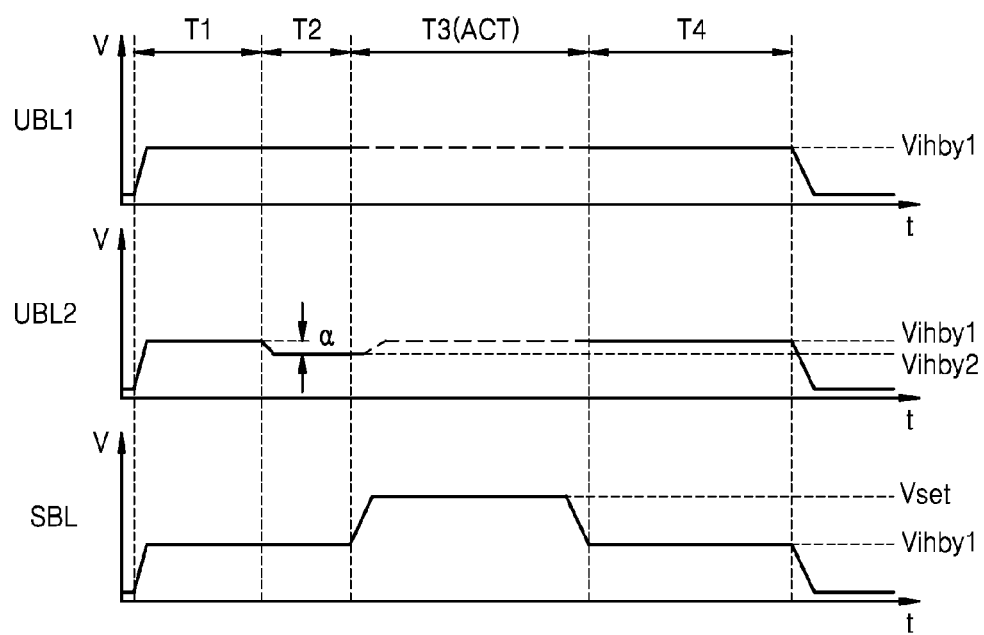
FIGS. 8A and 8B are timing diagrams of voltages applied to signals lines in a set writing operation, according to an embodiment of the inventive concept.
Figure 8B:
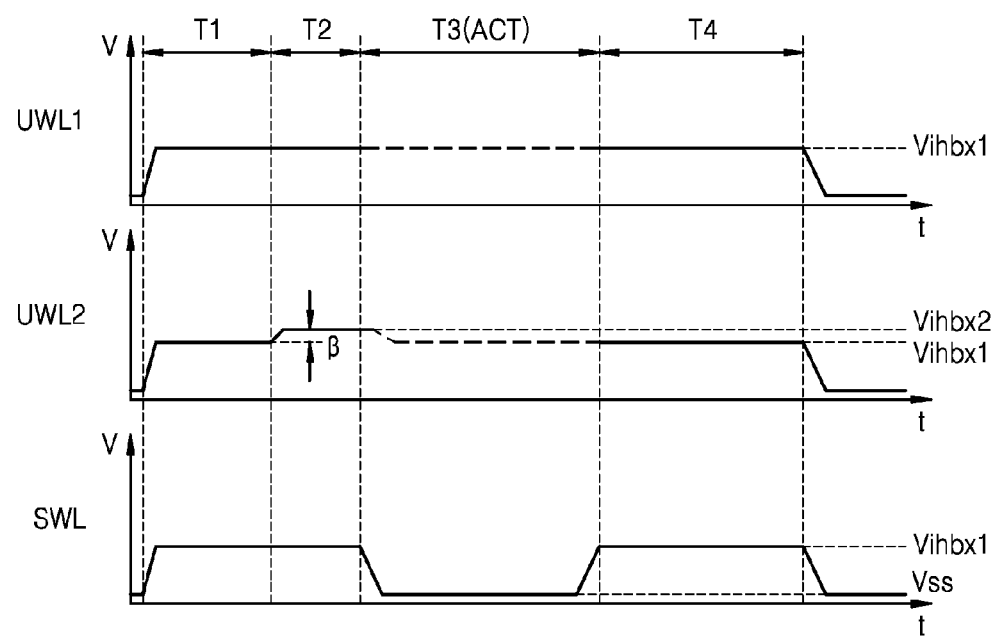

FIGS. 8A and 8B are timing diagrams of applying voltages to the signal lines during the set writing operation, according to an embodiment of the inventive concept. FIG. 8A is a timing diagram showing the voltages applied to the bit lines shown in the circuit diagram of FIG. 7, and FIG. 8B is a timing diagram showing the voltages applied to the word lines shown in the circuit diagram of FIG. 7.

Referring to FIG. 8A, in a first time period T1, the first column inhibit voltage Vihby1 is applied to the normal unselected bit lines UBL1. In the present embodiment, the first column inhibit voltage Vihby1 is applied to the adjacent unselected bit lines UBL2 and the selected bit line SBL, as well as the normal unselected bit lines UBL1, as shown in FIG. 8A.

In a second time period T2, the second column inhibit voltage Vihby2 is applied to the adjacent unselected bit lines UBL2. The second column inhibit voltage Vihby2 is lower than the first column inhibit voltage Vihby1. Therefore, the voltage level of the adjacent unselected bit lines UBL2 in the second time period T2 is lower than that of the adjacent unselected bit lines UBL2 in the first time period T1. In the present embodiment, at least one of the normal unselected bit line UBL1 and the selected bit line SBL may be floated in the second time period T2.

A third time period T3 is a selected memory cell activation period ACT. The set writing voltage Vset is applied to the selected bit line SBL in the third time period T3. The normal unselected bit line UBL1 and the adjacent unselected bit line UBL2 may be floated in the third time period T3. The adjacent unselected bit line UBL2 may be coupled to the selected bit line SBL. Therefore, the voltage level of the adjacent unselected bit line UBL2 may rise from the voltage level of the second column inhibit voltage Vihby2 to the voltage level of the first column inhibit voltage Vihby1 due to the set writing voltage Vset. The adjacent unselected bit line UBL2 may have substantially the same voltage level as that of the normal unselected bit line UBL1, that is, the voltage level of the first column inhibit voltage Vihby1. Accordingly, even when the adjacent unselected bit line UBL2 is coupled to the selected bit line SBL, an increase in the leakage current flowing in the unselected memory cells that are adjacent to the selected memory cell MC_sel may be prevented.

In a fourth time period T4, the first column inhibit voltage Vihby1 is applied to the bit lines UBL1, UBL2, and SBL. However, various embodiments of the inventive concept are not limited thereto. That is, the second column inhibit voltage Vihby2 or another voltage having a lower voltage level than that of the first column inhibit voltage Vihby1 may be applied to the bit lines UBL1, UBL2, and SBL in the fourth time period T4. Alternatively, the fourth time period T4 may be omitted, and the ground voltage Vss may be applied to the bit lines UBL1, UBL2, and SBL, or the bit lines UBL1, UBL2, and SBL may be floated.

In the present embodiment, the first and second column inhibit voltages Vihby1 and Vihby2 may be sequentially applied to one or more of the bit lines UBL1, UBL2, and SBL in the first and second periods T1 and T2; however, various embodiments are not limited thereto. An order of applying the first and second column inhibit voltages Vihby1 and Vihby2 to the bit lines UBL1, UBL2, and SBL is not limited to the example described with reference to FIG. 8A. For example, in another embodiment, the first and second column inhibit voltages Vihby1 and Vihby2 may be simultaneously applied to the normal unselected bit line UBL1 and the adjacent unselected bit line UBL2, respectively. Here, one of the first and second column inhibit voltages Vihby1 and Vihby2 may be applied to the selected bit line SBL, or the selected bit line SBL may be floated.

As another embodiment, the second column inhibit voltage Vihby2 may be applied to the adjacent unselected bit lines UBL2 or the bit lines UBL1, UBL2, and SBL in the first time period T1, and after that, the first column inhibit voltage Vihby1 may be applied to the normal unselected bit lines UBL1 or the bit lines UBL1 and SBL but not the adjacent unselected bit lines UBL2 in the second time period T2.

Referring to FIG. 8B, the first row inhibit voltage Vihbx1 is applied to the normal unselected word lines UWL1 in the first time period T1. In the present embodiment, the first row inhibit voltage Vihbx1 is also applied to the adjacent unselected word lines UWL2 and the selected word line SWL in the first time period T1, as well as the normal unselected word lines UWL1, as shown in FIG. 8B.

In the second time period T2, the second row inhibit voltage Vihbx2 is applied to the adjacent unselected word lines UWL2. The second row inhibit voltage Vihbx2 is higher than the first row inhibit voltage Vihbx1. Therefore, the voltage level of the adjacent unselected word lines UWL2 in the second time period T2 is higher than that of the adjacent unselected word lines UWL2 in the first time period T1. In the present embodiment, at least one of the normal unselected word lines UWL1 and the selected word line SWL may be floated in the second time period T2.

The third time period T3 may be a selected memory cell activation period ACT. The third time period T3 of FIG. 8B may overlap with or may be the same as the third time period T3 in FIG. 8A. In the third time period T3, the ground voltage Vss is applied to the selected word line SWL. In the third time period T3, the normal unselected word lines UWL1 and the adjacent unselected word lines UWL2 may be floated. The adjacent unselected word lines UWL2 may be coupled to the selected word line SWL. The voltage of the adjacent unselected word lines UWL2 may therefore decrease from the voltage level of the second row inhibit voltage Vihbx2 to the voltage level of the first row inhibit voltage Vihbx1 due to the ground voltage Vss. The adjacent unselected word lines UWL2 may have a voltage level that is substantially the same as that of the normal unselected word lines UWL1. Accordingly, even when the adjacent unselected word lines UWL2 are coupled to the selected word line SWL, an increase of the leakage current in the unselected memory cells MC that are adjacent to the selected memory cell MC may be prevented.

In the fourth time period T4, the first row inhibit voltage Vihbx1 is applied to the word lines UWL1, UWL2, and SWL. However, various embodiments of the inventive concept are not limited thereto. For example, the second row inhibit voltage Vihbx2 or another voltage having a voltage level higher than that of the first row inhibit voltage Vihbx1 may be applied to the word lines UWL1, UWL2, and SWL. Alternatively, the fourth time period T4 may be omitted, and the ground voltage may be applied to the word lines UWL1, UWL2, and SWL, or the word lines UWL1, UWL2, and SWL may be floated.

In addition, in the present embodiment, the first row inhibit voltage Vihbx1 and the second row inhibit voltage Vihbx2 are sequentially applied to the word lines UWL1, UWL2, and SWL in the first and second periods T1 and T2; however, various embodiments of the inventive concept are not limited thereto. That is, the order of applying the first row inhibit voltage Vihbx1 and the second row inhibit voltage Vihbx2 to the word lines UWL1, UWL2, and SWL is not limited to the example described with reference to FIG. 8B. In another embodiment, the first row inhibit voltage Vihbx1 and the second row inhibit voltage Vihbx2 may be simultaneously applied to the normal unselected word lines UWL1 and the adjacent unselected word lines UWL2, respectively. Here, one of the first row inhibit voltage Vihbx1 and the second row inhibit voltage Vihbx2 may be applied to the selected word line SWL, or the selected word line SWL may be floated.

In another embodiment, in the first time period T1, the second column inhibit voltage Vihby2 may be applied to the adjacent unselected word lines UWL2 or the word lines UWL1, UWL2, and SWL, and in the second time period T2, the first column inhibit voltage Vihby1 may be applied to the normal unselected word lines UWL1 or the word lines UWL1 and SWL except for the adjacent unselected word lines UWL2.

Figure 9:
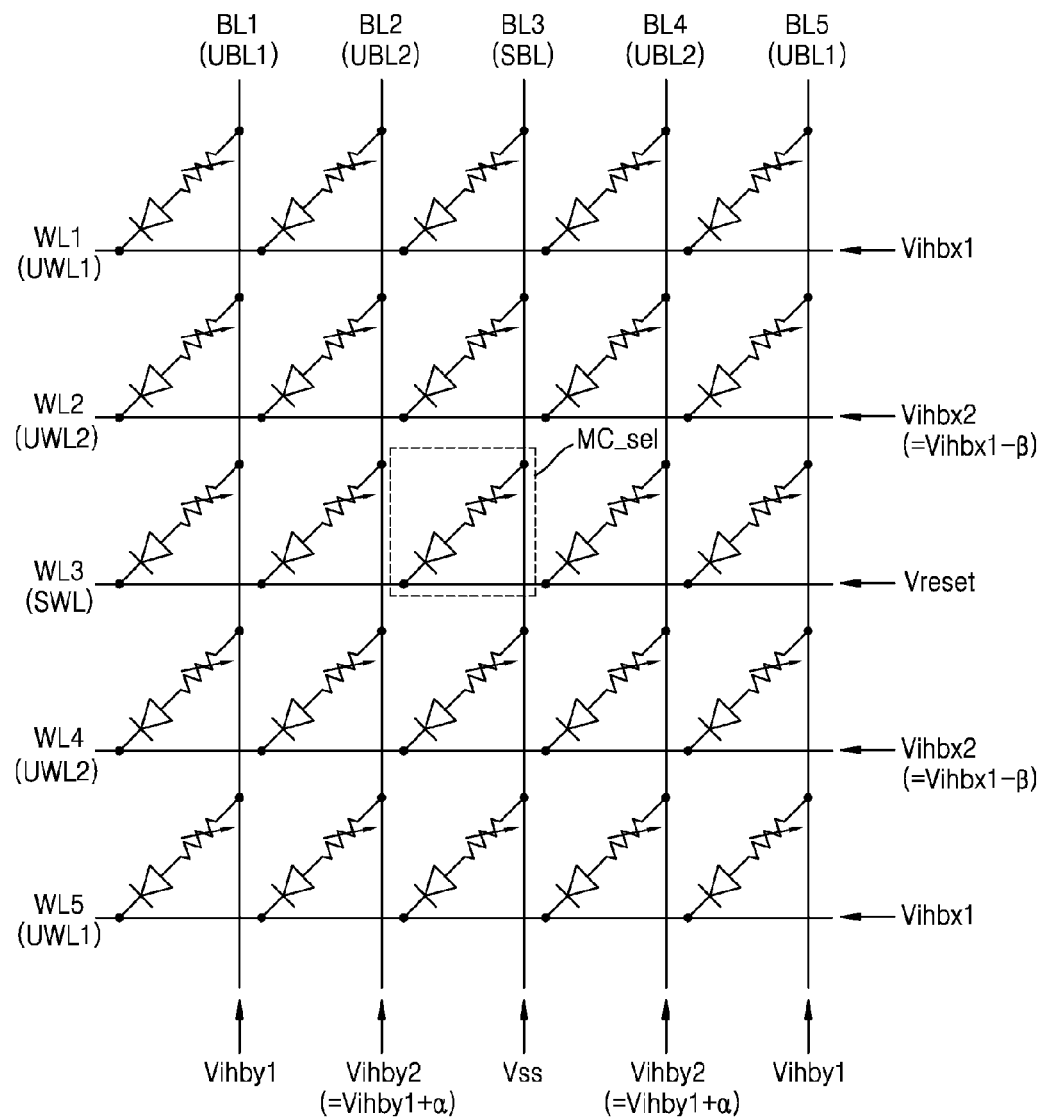
FIG. 9 is a circuit diagram of voltages applied to signal lines in a reset writing operation, according to an embodiment of the inventive concept.

FIG. 9 is a circuit diagram showing voltages applied to the signal lines during a reset writing operation, according to an embodiment of the inventive concept.

Referring to FIG. 9, the first voltage, for example, the first column inhibit voltage Vihby1, is applied to the normal unselected bit lines UBL1, the second voltage, for example, the second column inhibit voltage Vihby2, is applied to the adjacent unselected bit lines UBL2, and the third voltage, for example, the ground voltage Vss, is applied to the selected bit line SBL. Hereinafter, it is assumed that the first voltage is the first column inhibit voltage Vihby1, the second voltage is the second column inhibit voltage Vihby2, and the third voltage is the ground voltage Vss during the reset writing operation.

The voltage levels of the first and second column inhibit voltages Vihby1 and Vihby2 during the reset writing operation may be different from those of the first and second column inhibit voltages Vihby1 and Vihby2 during the set writing operation of FIG. 7. For example, the first column inhibit voltage Vihby1 may be higher than the ground voltage Vss and may be lower than the second column inhibit voltage Vihby2. In the present embodiment, the first column inhibit voltage Vihby1 may have a voltage level that is equal to or higher than half the voltage level of the reset writing voltage Vreset applied to the selected word line SWL. In another embodiment, the first column inhibit voltage Vihby1 may be set to minimize leakage current flowing in unselected memory cells MC during the reset writing operation.

In various embodiments, a difference $\alpha$ between the first column inhibit voltage Vihby1 and the second column inhibit voltage Vihby2 may be determined in consideration of a difference between the ground voltage Vss and the first column inhibit voltage Vihby1. For example, the voltage difference $\alpha$ between the first column inhibit voltage Vihby1 and the second column inhibit voltage Vihby2 may be set to be less than the voltage difference between the ground voltage Vss and the first column blocking voltage Vihby1. As another example, when the voltage difference between the ground voltage Vss and the first column inhibit voltage Vihby1 increases, the voltage difference $\alpha$ between the first column inhibit voltage Vihby1 and the second column inhibit voltage Vihby2 may be set to be larger. Otherwise, the voltage difference $\alpha$ between the first column inhibit voltage Vihby1 and the second column inhibit voltage Vihby2 may be set in advance according to an operation mode performed on the memory cell array 110. In the present embodiment, the voltage difference $\alpha$ according to the reset writing operation may be set in advance.

In an embodiment, the fourth voltage, for example, the first row inhibit voltage Vihbx1, is applied to the normal unselected word lines UWL1, and the fifth voltage, for example, the second row inhibit voltage Vihbx2, is applied to the adjacent unselected word lines UWL2, and the sixth voltage, for example, the reset writing voltage Vreset, is applied to the selected word line SWL. The first row inhibit voltage Vihbx1 may be lower than the reset writing voltage Vreset and higher than the second row inhibit voltage Vihbx2. For example, the first row inhibit voltage Vihbx1 may have a voltage level that is equal to or less than half the voltage level of the reset writing voltage Vreset. As another example, the first row inhibit voltage Vihbx1 may be set in advance in order to minimize leakage current flowing in the unselected memory cells during the reset writing operation. In the present embodiment, the voltage level of the first row inhibit voltage Vihbx1 may be equal to or lower than the voltage level of the first column inhibit voltage Vihby1.

In various embodiments of the inventive concept, a voltage difference $\beta$ between the first row inhibit voltage Vihbx1 and the second row inhibit voltage Vihbx2 may be determined in consideration of a voltage difference between the reset writing voltage Vreset and the first row inhibit voltage Vihbx1. As an example, the voltage difference $\beta$ between the first row inhibit voltage Vihbx1 and the second row inhibit voltage Vihbx2 may be set to be less than the voltage difference between the reset writing voltage Vreset and the first row inhibit voltage Vihbx1. As another example, when the voltage difference between the reset writing voltage Vreset and the first row inhibit voltage Vihbx1 increases, the voltage difference $\beta$ between the first row inhibit voltage Vihbx1 and the second row inhibit voltage Vihbx2 may be set to be larger. Otherwise, the voltage difference $\beta$ between the first row inhibit voltage Vihbx1 and the second row inhibit voltage Vihbx2 may be set in advance according to an operation mode performed on the memory cell array 110. In the present embodiment, the voltage difference $\beta$ according to the set writing operation may be set in advance.

In the present embodiment, at least two column inhibit voltages, namely, first and second column inhibit voltages Vihby1 and Vihby2, are applied to the unselected bit lines BL1, BL2, BL4, and BL5, and at the same time, at least two row inhibit voltages, namely, first and second row inhibit voltages Vihbx1 and Vihbx2, are applied to the unselected word lines WL1, WL2, WL4, and WL5. However, various embodiments of the inventive concept are not limited thereto. In various embodiments, at least two column inhibit voltages, namely, first and second column inhibit voltages Vihby1 and Vihby2, may be applied to the unselected bit lines BL1, BL2, BL4, and BL5, and one row inhibit voltages, for example, the first row inhibit voltage Vihbx1, may be applied to the unselected word lines WL1, WL2, WL4, and WL5. In another embodiment, at least two row inhibit voltages, namely, first and second row inhibit voltages Vihbx1 and Vihbx2, may be applied to the unselected word lines W1, W2, W4, and W5, and one column inhibit voltage, for example, the first row inhibit voltage Vihbx1, may be applied to the unselected bit lines BL1, BL2, BL4, and BL5.

Figure 10A:
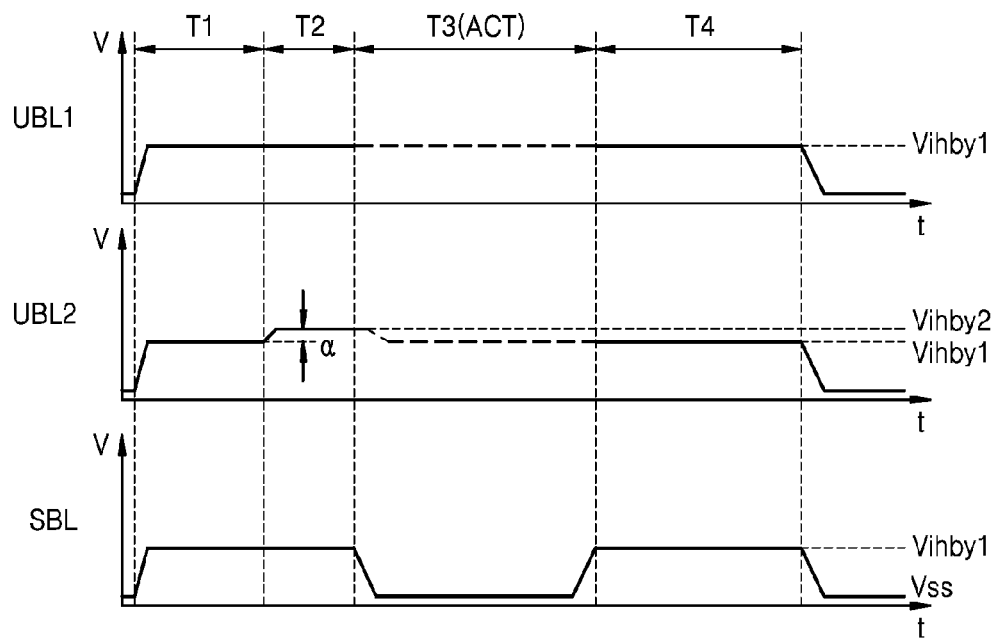
FIGS. 10A and 10B are timing diagrams of voltages applied to signal lines in a set writing operation, according to an embodiment of the inventive concept.
Figure 10B:
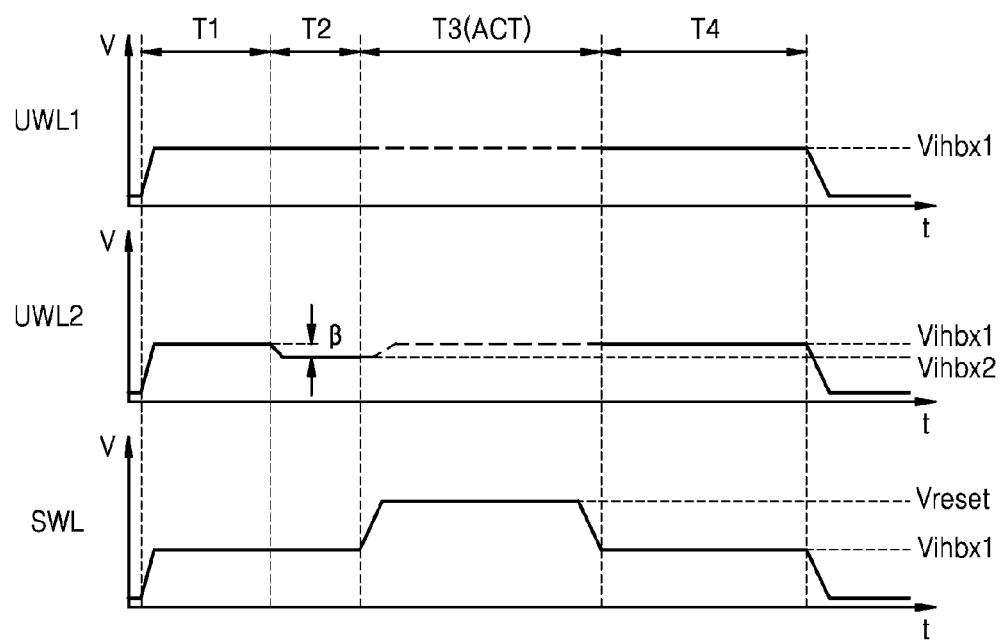

FIGS. 10A and 10B are timing diagrams of applying voltages to the signal lines during the reset writing operation, according to the embodiment of the inventive concept. FIG. 10A is a timing diagram of the voltages applied to the bit lines in the circuit diagram of FIG. 9, and FIG. 10B is a timing diagram of the voltages applied to the word lines in the circuit diagram of FIG. 9.

Referring to FIG. 10A, in the first time period T1, the first column inhibit voltage Vihby1 is applied to the normal unselected bit lines UBL1. In the present embodiment, as shown in FIG. 10A, the first column inhibit voltage Vihby1 is applied to the adjacent unselected bit lines UBL2 and the selected bit line SBL in the first time period T1, as well as the normal unselected bit lines UBL1.

In the second time period T2, the second column inhibit voltage Vihby2 is applied to the adjacent unselected bit lines UBL2. The second column inhibit voltage Vihby2 is higher than the first column inhibit voltage Vihby1. Therefore, the voltage level of the adjacent unselected bit lines UBL2 in the second time period T2 is greater than that of the adjacent unselected bit lines UBL2 in the first time period T1. In the present embodiment, at least one of the normal unselected bit lines UBL1 and the selected bit line SBL may be floated in the second time period T2.

The third time period T3 may be a selected memory cell activation period. In the third time period T3, the ground voltage Vss is applied to the selected bit line SBL. The normal unselected bit lines UBL1 and the adjacent unselected bit lines UBL2 may be floated in the third time period T3. The voltage of the adjacent unselected bit lines UBL2 may decrease from the voltage level of the second column inhibit voltage Vihby2 to the voltage level of the first column inhibit voltage Vihby1 due the influence of the ground voltage Vss. The adjacent unselected bit lines UBL2 may have a voltage level that is substantially the same as that of the normal unselected bit lines UBL1, for example, the first column inhibit voltage Vihby1. Accordingly, even when the adjacent unselected bit lines UBL2 are coupled to the selected bit line SBL, the increase in leakage current in the unselected memory cells that are adjacent to the selected memory cell MC may be prevented.

In the fourth time period T4, the first column inhibit voltage Vihby1 is applied to the bit lines UBL1, UBL2, and SBL. However, various embodiments of the inventive concept are not limited thereto. The second column inhibit voltage Vihby2 or another voltage having a voltage level that is higher than that of the first column inhibit voltage Vihby1 may be applied to the bit lines UBL1, UBL2, and SBL. Alternatively, the fourth time period T4 may be omitted, and the ground voltage may be applied to the bit lines UBL1, UBL2, and SBL, or the bit lines UBL1, UBL2, and SBL may be floated.

In addition, similar to FIG. 8A, an order of applying the first column inhibit voltage Vihby1 and the second column inhibit voltage Vihby2 to the bit lines UBL1, UBL2, and SBL is not limited to the example described with reference to FIG. 10A, but may be variously changed within the first and second periods T1 and T2.

Referring to FIG. 10B, the first row inhibit voltage Vihbx1 is applied to the normal unselected word lines UWL1 in the first time period T1. In the present embodiment, the first row inhibit voltage Vihbx1 is also applied to the adjacent unselected word lines UWL2 and the selected word line SWL in the first time period T1, as well as the normal unselected word lines UWL1, as shown in FIG. 10B.

In the second time period T2, the second row inhibit voltage Vihbx2 is applied to the adjacent unselected word lines UWL2. The second row inhibit voltage Vihbx2 is less than the first row inhibit voltage Vihbx1. Therefore, the voltage level of the adjacent unselected word lines UWL2 in the second time period T2 is lower than that of the adjacent unselected word lines UWL2 in the first time period T1. In the present embodiment, at least one of the normal unselected word lines UWL1 and the selected word line SWL may be floated in the second time period T2.

The third time period T3 may be a selected memory cell activation period. In the third time period T3, the reset writing voltage Vreset is applied to the selected word line SWL. In the third time period T3, the normal unselected word lines UWL1 and the adjacent unselected word lines UWL2 may be floated. The adjacent unselected word lines UWL2 may be coupled to the selected word line SWL. The voltage of the adjacent unselected word lines UWL2 may rise from the voltage level of the second row inhibit voltage Vihbx2 to the voltage level of the first row inhibit voltage Vihbx1 due to influence of the reset writing voltage Vreset. The adjacent unselected word lines UWL2 may have a voltage level that is substantially the same as that of the normal unselected word lines UWL1. Accordingly, even when the adjacent unselected word lines UWL2 are coupled to the selected word line SWL, an increase of leakage current in the unselected memory cells that are adjacent to the selected memory cell MC may be prevented.

In the fourth time period T4, the first row inhibit voltage Vihbx1 is applied to the word lines UWL1, UWL2, and SWL. However, various embodiments of the inventive concept are not limited thereto. For example, the second row inhibit voltage Vihbx2 or another voltage having a voltage level that is lower than that of the first row inhibit voltage Vihbx1 may be applied to the word lines UWL1, UWL2, and SWL. Alternatively, the fourth time period T4 may be omitted, and the ground voltage may be applied to the word lines UWL1, UWL2, and SWL, or the word lines UWL1, UWL2, and SWL may be floated.

In addition, similar to FIG. 8B, an order of applying the first row inhibit voltage Vihbx1 and the second row inhibit voltage Vihbx2 is not limited to the example described with reference to FIG. 10B, but may be changed variously within the first and second periods T1 and T2.

Figure 11:
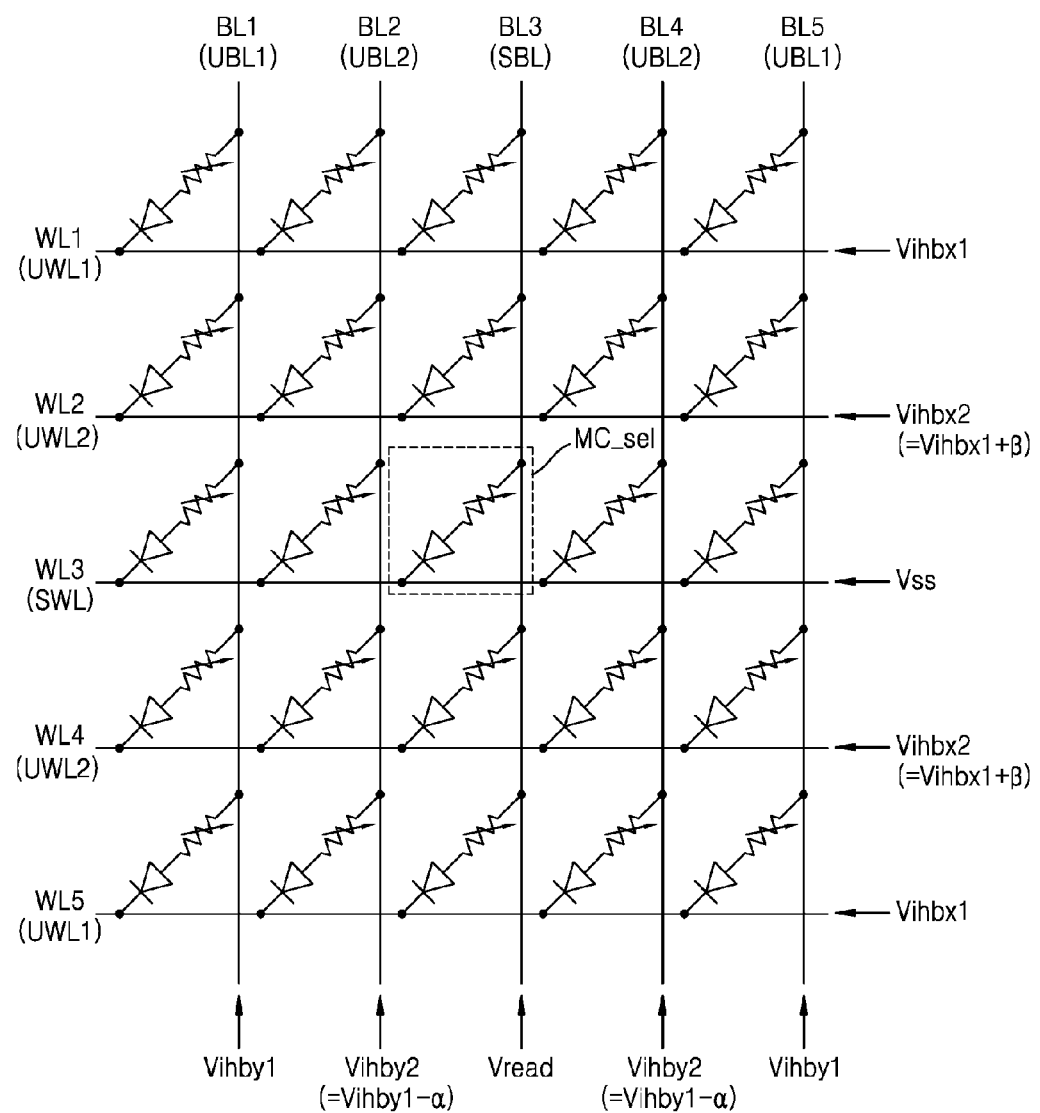
FIG. 11 is a circuit diagram of voltages applied to signal lines in a reading operation, according to an embodiment of the inventive concept.

FIG. 11 is a circuit diagram showing voltages applied to the signal lines during a reading operation, according to an embodiment of the inventive concept.

Referring to FIG. 11, the first voltage, for example, the first column inhibit voltage Vihby1, is applied to the normal unselected bit lines UBL1, the second voltage, for example, the second column inhibit voltage Vihby2, is applied to the adjacent unselected bit lines UBL2, and the third voltage, for example, a reading voltage Vread, is applied to the selected bit line SBL. Hereinafter, it is assumed that the first voltage is the first column inhibit voltage Vihby1, the second voltage is the second column inhibit voltage Vihby2, and the third voltage is the reading voltage Vread during the reading operation.

Voltage levels of the first and second column inhibit voltages Vihby1 and Vihby2 in the reading operation may be different from the voltage levels of the first and second column inhibit voltages Vihby1 and Vihby2 in the set writing operation shown in FIG. 7 and the reset writing operation shown in FIG. 9. Also, the reading voltage Vread may be less than the set writing voltage Vset and the reset writing voltage Vreset. The first column inhibit voltage Vihby1 may be less than the reading voltage Vread and may be higher than the second column inhibit voltage Vihby2. In the present embodiment, the first column inhibit voltage Vihby1 may have a voltage level that is equal to or less than half of the voltage level of the reading voltage Vread. As another example, the first column inhibit voltage Vihby1 may be set to minimize leakage current flowing in the unselected memory cells MC during the reading operation.

In various embodiments of the inventive concept, a voltage difference α between the first column inhibit voltage Vihby1 and the second column inhibit voltage Vihby2 may be determined in consideration of a voltage difference between the reading voltage Vread and the first column inhibit voltage Vihby1. Otherwise, the voltage difference α may be set in advance with respect to the reading operation.

In an embodiment, the fourth voltage, for example, the first row inhibit voltage Vihbx1, may be applied to the normal unselected word lines UWL1, the fifth voltage, for example, the second row inhibit voltage Vihbx2, may be applied to the adjacent unselected word lines UWL2, and the sixth voltage, for example, the ground voltage Vss, may be applied to the selected word line SWL. The first row inhibit voltage Vihbx1 may be higher than the ground voltage Vss and may be less than the second row inhibit voltage Vihbx2. For example, the first row inhibit voltage Vihbx1 may have a voltage level that is equal to or higher than half of the voltage level of the reading voltage Vread. As another example, the first row inhibit voltage Vihbx1 may be set in advance to minimize leakage current flowing in the unselected memory cells during the reading operation. In the present embodiment, the voltage level of the first row inhibit voltage Vihbx1 may be equal to or higher than that of the first column inhibit voltage Vihby1.

In various embodiments of the inventive concept, a voltage difference β between the first row inhibit voltage Vihbx1 and the second row inhibit voltage Vihbx2 may be determined in consideration of a voltage difference between the ground voltage Vss and the first row inhibit voltage Vihbx1. In another embodiment, the voltage difference β between the first row inhibit voltage Vihbx1 and the second row inhibit voltage Vihbx2 is set in advance according to an operation mode performed on the memory cell array 110, and the voltage difference β according to the reading operation may be set in advance.

As described above with reference to FIGS. 7 and 9, one row inhibit voltage, for example, the first row inhibit voltage Vihbx1, may be selectively applied to the unselected word lines WL1, WL2, WL4, and WL5, or one column inhibit voltage, for example, first column inhibit voltage Vihby1, may be applied to the unselected bit lines BL1, BL2, BL4, and BL5.

In addition, the timing diagrams of voltages applied to the signal lines during the reading operation according to the embodiment of the inventive concept is similar to the timing diagrams of the voltages applied to the signal lines during the set writing operation shown in FIGS. 8A and 8B. However, the voltage level of the reading voltage Vread may be different from that of the set writing voltage Vset, and accordingly, the voltage levels of the first and second column inhibit voltages Vihby1 and Vihby2 and the first and second row inhibit voltages Vihbx1 and Vihbx2 may be different from those of the first and second column inhibit voltages Vihby1 and Vihby2 and the first and second row inhibit voltages Vihbx1 and Vihbx2 shown in FIGS. 8A and 8B. Other timings and/or types of applied voltages are similar to those of FIGS. 8A and 8B, and detailed descriptions thereof are repeated herein.

Figure 12:
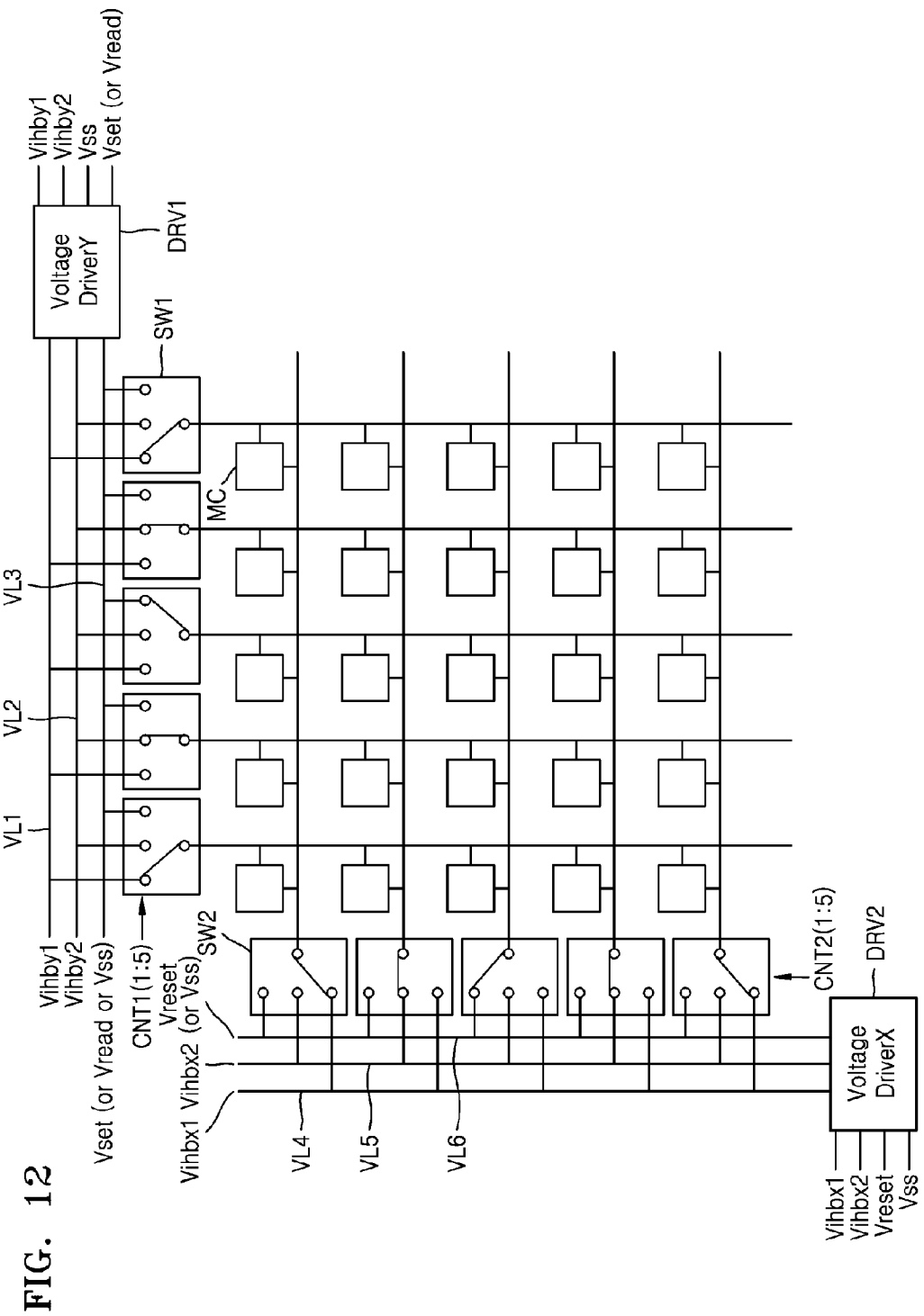
FIG. 12 is a circuit diagram for applying voltages to the signal lines, according to an embodiment of the inventive concept.

FIG. 12 is a circuit diagram for applying voltages to the signal lines, according to an embodiment of the inventive concept.

In FIG. 12, the first and second column inhibit voltages Vihby1 and Vihby2, the ground voltage Vss, the set writing voltage Vset, and the reading voltage Vread are applied to a first voltage driver DRV1. The first voltage driver DRV1 outputs the first column inhibit voltage Vihby1 through a first voltage line VL1, outputs the second column inhibit voltage Vihby2 through a second voltage line VL2, and outputs one of the set writing voltage Vset, the reading voltage Vread, and the ground voltage Vss through a third voltage line VL3. For example, the first voltage driver DRV1 may output the set writing voltage Vset through the third voltage line VL3 in the set writing operation. In the present embodiment, the first voltage driver DRV1 may internally generate the second column inhibit voltage Vihby2 based on the first column inhibit voltage Vihby1, and thereby provide the second column inhibit voltage Vihby2.

Multiple first switches SW1 are provided, and may be based on metal-oxide semiconductor field effect transistors (MOSFETs), for example. The first voltage driver DRV1 selects one of the first and second column inhibit voltages Vihby1 and Vihby2, and the set writing voltage Vset (or the reading voltage Vread or the ground voltage Vss) in response to a corresponding signal from among first control signals CNT1 (1:5). The first voltage driver DRV1 then provides the selected voltage to each of the bit lines BL1 through BL5, or may float one or more of the bit lines BL1 through BL5.

The first control signals CNT1 (1:5) may be generated in the column decoder 160 based on the column address X_ADDR and timing signals transmitted from the control logic 130 of FIG. 2. In another embodiment, the first control signals CNT1 (1:5) may be transmitted from the control logic 130.

The first and second row inhibit voltages Vihbx 1 and Vihb2, the ground voltage Vss, and the reset writing voltage Vreset are applied to a second voltage driver DRV2. The second voltage driver DRV2 may output the first row inhibit voltage Vihbx1 through a fourth voltage line VL4, output the second row inhibit voltage Vihbx2 through a fifth voltage line VL5, and output one of the reset writing voltage Vreset and the ground voltage Vss through a sixth voltage line VL6. For example, in a reset writing operation, the second voltage driver DRV2 may output the reset writing voltage Vreset through the sixth voltage line VL6. In the present embodiment, the second voltage driver DRV2 may internally generate the second row inhibit voltage Vihbx2 based on the first row inhibit voltage Vihbx1, and thereby provide the second row inhibit voltage Vihbx2.

Multiple second switches SW2 may be based on MOSFETs, for example. The second switches SW2 respectively select one of the first and second row inhibit voltages Vihbx1 and Vihbx2, and the reset writing voltage Vreset (or the ground voltage Vss) in response to a corresponding signal from among second control signals CNT2 (1:5). The second switches SW2 then provide the selected voltage to each of the word lines WL1 through WL5, or may float one or more of the word lines WL1 through WL5.

The second control signals CNT2 (1:5) may be generated by the row decoder 150 based on the row address Y_ADDR and timing signals transmitted from the control logic 130 of FIG. 2. In another embodiment, the second control signals CNT2 (1:5) may be transmitted from the control logic 130.

In the present embodiment, the first and second voltage drivers DRV1 and DRV2 and the first and second switches SW1 and SW2 may be included in the column decoder 160 and the row decoder 150 shown in FIG. 2, respectively. For example, the first voltage driver DRV1, the first through third voltage lines VL1-VL3, and the first switches SW1 connected to the bit lines BL1-BL5 may be included in the column decoder 160. The second voltage driver DRV2, the fourth through sixth voltage lines VL4-VL6, and the second switches SW2 connected to the word lines WL1-WL5 may be included in the row decoder 150.

In another embodiment, the first and second voltage drivers DRV1 and DRV2, and the first and second switches SW1 and SW2 may be included in an additional switching block separate from the column decoder 160 and the row decoder 150. Also, the first and second voltage drivers DRV1 and DRV2 may be realized as a part of the voltage generator 140 shown in FIG. 2.

Figure 13:
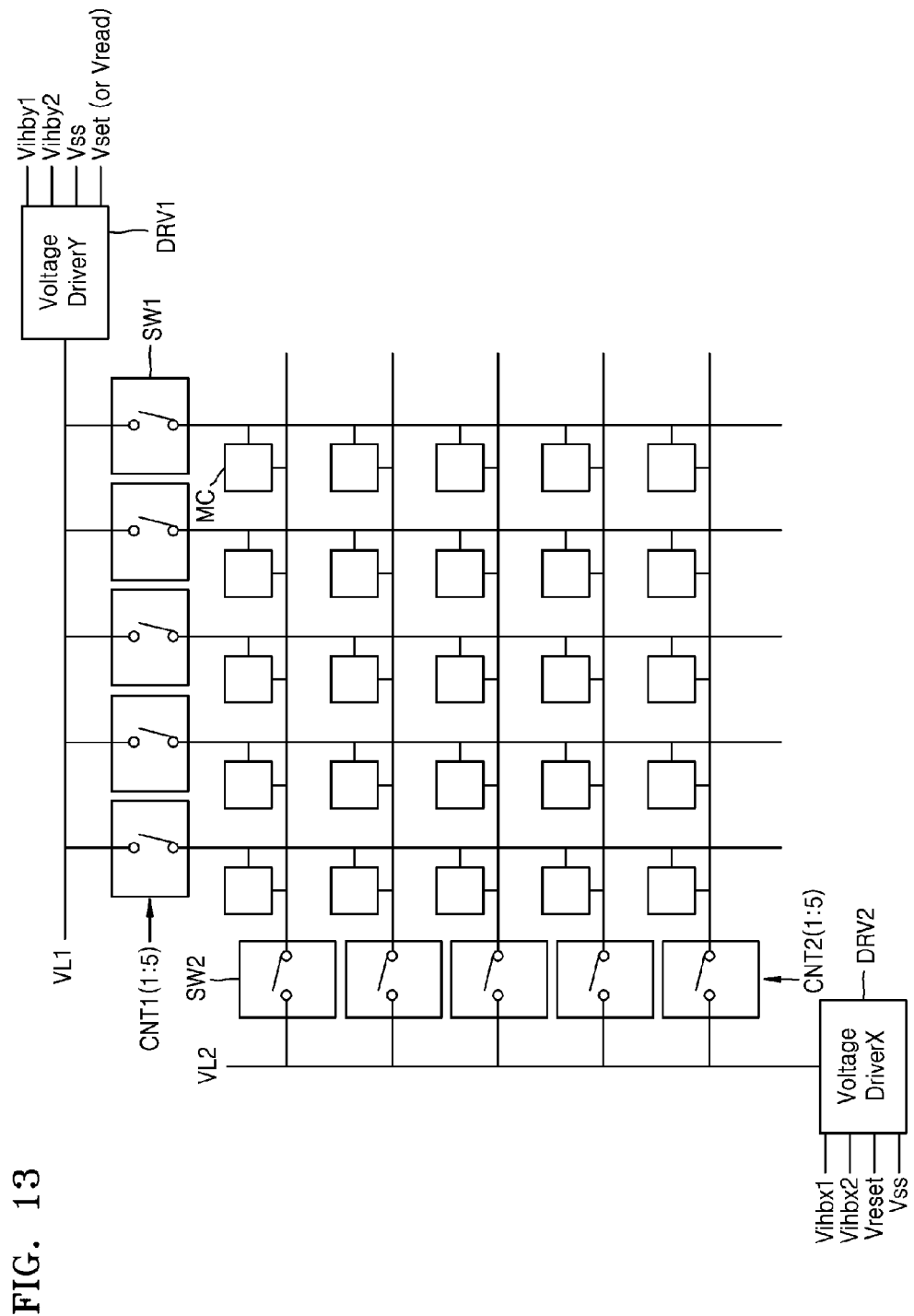
FIG. 13 is a circuit diagram for applying voltage to signal lines, according to an embodiment of the inventive concept.

FIG. 13 is a circuit diagram showing another example of applying voltages to signal lines, according to an embodiment of the inventive concept.

Referring to FIG. 13, the first and second column inhibit voltages Vihby1 and Vihby2, the ground voltage Vss, the set writing voltage Vset, and the reading voltage Vread are applied to the first voltage driver DRV1, and the first voltage driver DRV1 sequentially outputs the voltages through the first voltage line VL1. The first switches SW1 may be turned on or turned off in response to the first control signals CNT1 (1:5) to provide the voltages that are required by the bit lines BL1-BL5. For example, a first switch SW1 connected to the normal unselected bit line from among the plurality of first switches SW1 is turned on when the first column inhibit voltage Vihby1 is output through the first voltage line VL1, a first switch SW1 connected to the adjacent unselected bit line is turned on when the second column inhibit voltage Vihby2 is output through the first voltage line VL1, and a first switch SW1 connected to the selected bit line may be turned on when one of the set writing voltage, the reading voltage Vread, and the ground voltage Vss is output.

The first and second row inhibit voltage Vihbx1 and Vihbx2, the ground voltage Vss, the reset writing voltage Vreset are applied to the second voltage driver DRV2, and the second voltage driver DRV2 sequentially outputs the voltages through the second voltage line VL2. The second switches SW2 are turned on or turned off in response to the second control signals CNT2 (1:5) respectively to provide the voltages that are required by the word lines WL1-WL5. For example, from among the multiple second switches SW2, a second switch SW2 connected to the normal unselected word line is turned on when the first row inhibit voltage Vihbx1 is output through the second voltage line VL2, a second switch SW2 connected to the adjacent unselected word line is turned on when the second column inhibit voltage Vihby2 is output through the second voltage line VL2, and the second switch SW2 connected to the selected word line may be turned on when the reset writing voltage Vreset or the ground voltage Vss is output through the second voltage line VL2.

The examples of circuit diagrams for applying the voltages to the signal lines as described with reference to FIGS. 1 through 11 are described above with reference to FIGS. 12 and 13. However, technical features of the inventive concept are not limited to the description with reference to FIGS. 12 and 13, and various modified examples may be also applied to the embodiments of the inventive concept.

Figure 14:
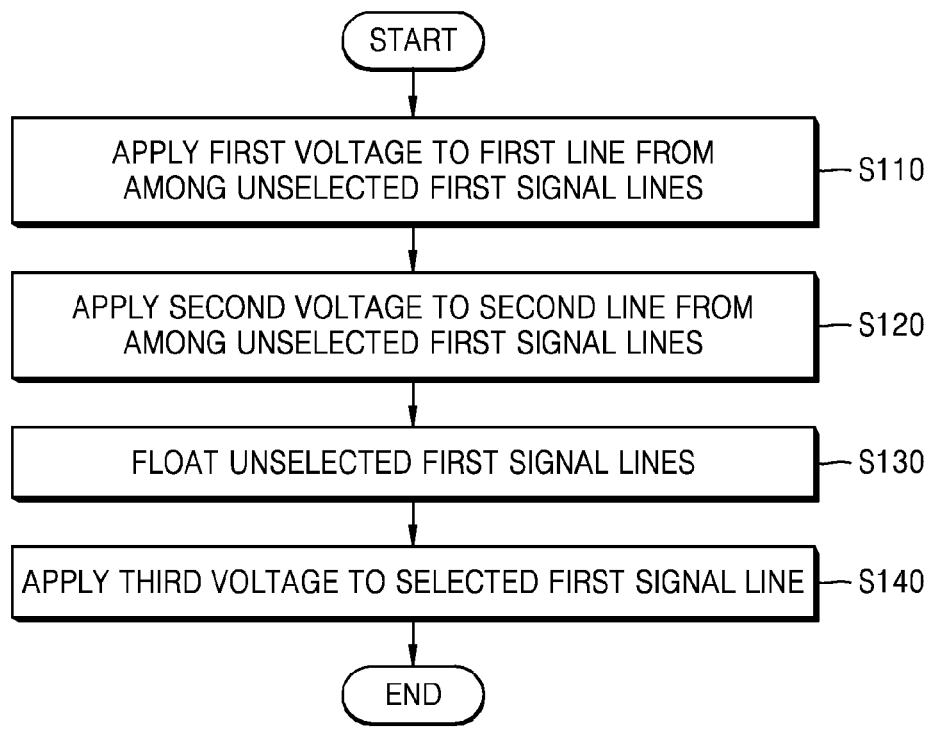
FIG. 14 is a flowchart of a method of operating a memory device, according to an embodiment of the inventive concept.

FIG. 14 is a flowchart of a method of operating a memory device, according to an embodiment of the inventive concept.

Referring to FIG. 14, the method of operating a memory device, according to the present embodiment, is a method of applying driving voltages to a memory cell array included in the memory device. The descriptions above with reference to FIGS. 1 through 13 may be applied to the method of operating a memory device, according to the present embodiment.

A first voltage is applied to a first line from among unselected first signal lines connected to unselected memory cells MC (S110), and a second voltage is applied to a second line from among the unselected first signal lines (S120). For example, the first signal line may be a word line or a bit line connected to the memory cell. Hereinafter, it will be assumed that the first signal line is a bit line. From among the first signal lines, the first line may be a normal unselected signal line and the second line may be an adjacent unselected signal line that is adjacent to a selected signal line. For example, from among the first signal lines, the first line may be a normal unselected bit line and the second line may be an adjacent unselected bit line. The voltage levels of the first voltage and the second voltage may differ. For example, in the set writing operation and the reading operation, the second voltage may be less than the first voltage. In addition, in the reset writing operation, the second voltage may be higher than the first voltage. In addition, the process of applying the first voltage (S110) and the process of applying the second voltage (S120) may be performed simultaneously. In another embodiment, the process of applying the second voltage (S120) may be performed before the process of applying the first voltage (S110). Also, as another embodiment, the process of applying the second voltage (S120) may be performed after the process of applying the first voltage (S110).

Next, the unselected first signal lines may be floated (S130). The first and second lines from among the unselected first signal lines may be both floated. In addition, in the present embodiment, the floating of the first signal lines 130 may include a process of floating the first line from among the unselected first signal lines and a process of floating the second line. The process of floating the first line is performed after the applying of the first voltage to the first line (S110), and the process of floating the second line is performed after applying the second voltage to the second line (S120). In another embodiment, the first and second lines may be simultaneously floated after applying the first voltage to the first line (S110) and applying the second voltage to the second line (S120).

After floating the unselected first signal lines, a third voltage may be applied to a selected first signal line (S140). The third voltage may be higher than the first and second voltages, or may be less than the first and second voltages. For example, the third voltage may be one of the set writing voltage, the reset writing voltage, the reading voltage, and the ground voltage.

The unselected first signal lines may maintain the voltage levels of the voltages applied previously even after being floated. The first line may maintain the voltage level of the first voltage and the second line may maintain the voltage level of the second voltage. Here, the third voltage is applied to the selected first signal line, and thus, the second line that is adjacent to the selected first signal line from among the unselected first signal lines is coupled to the third voltage, and thus, the voltage level of the second line may become higher or lower than that of the second voltage. The second voltage is compensated for in advance in consideration of the coupling to the third voltage, and thus, the voltage level of the second line may be substantially the same as the voltage level of the first line, that is, the voltage level of the first voltage, through the coupling operation.

Figure 15:
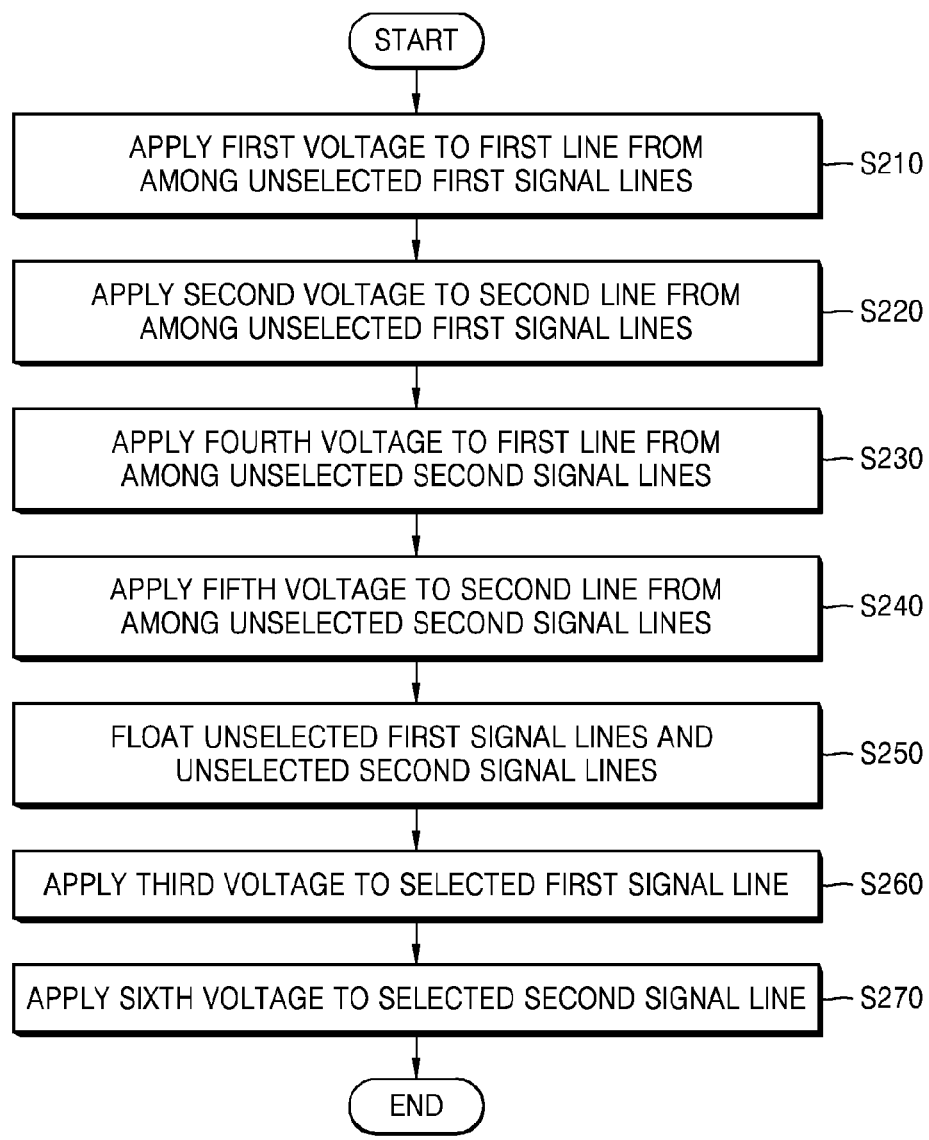
FIG. 15 is a flowchart of a method of operating a memory device, according to an embodiment of the inventive concept.

FIG. 15 is a flowchart of a method of operating a memory device, according to another embodiment of the inventive concept. The method of operating a memory device, according to the present embodiment, is a method of applying driving voltages to the memory cell array in the memory device. The above descriptions with reference to FIGS. 1 through 13 may be also applied to the method of operating a memory device, according to the present embodiment.

A first voltage is applied to a first line from among the unselected first signal lines (S210), and a second voltage is applied to a second line from among the unselected first signal lines (S220). A fourth voltage is applied to a first line from among unselected second signal lines (S230), and a fifth voltage is applied to a second signal from among the unselected second signal lines (S240). Applying the first, second, fourth, and fifth voltages (S210), (S220), (S230), and (S240) may be performed simultaneously, or time periods of applying the first, second, fourth, and fifth voltages may overlap with each other.

When the first signal line is the bit line and the second signal line is the word line, the first line of the unselected first signal lines may be a normal unselected bit line and the second line may be an adjacent unselected bit line that is adjacent to the selected bit line. The first line of the unselected second signal lines may be a normal unselected word line, and the second line may be an adjacent unselected word line that is adjacent to the selected word line. Here, the first voltage may be a first column inhibit voltage and the second voltage may be a second column inhibit voltage that is higher or lower than the first column inhibit voltage. The fourth voltage may be a first row inhibit voltage and the fifth voltage may be a second row inhibit voltage that is higher than or lower than the first row inhibit voltage.

Next, the first and second signal lines are floated (S250). The inhibit voltages are not applied to the first and second signal lines (S250).

After floating the first and second signal lines, a third voltage is applied to the selected first signal line (S260), and a sixth voltage may be applied to the selected second signal line (S270). The applying of the third voltage (S260) and applying of the sixth voltage (S270) may be performed simultaneously, or time periods of applying the third and sixth voltages may overlap with each other.

For example, when the first signal line is a bit line, the second signal line is a word line, and the set writing operation or the reading operation is performed on the memory cell array, the third voltage may be the set writing voltage or the reading voltage, respectively. Also, the first voltage is less than the third voltage, and the second voltage may be less than the first voltage. The sixth voltage may be the ground voltage, the fourth voltage may be higher than the first voltage, and the fifth voltage may be less than the fourth voltage.

Figure 16:
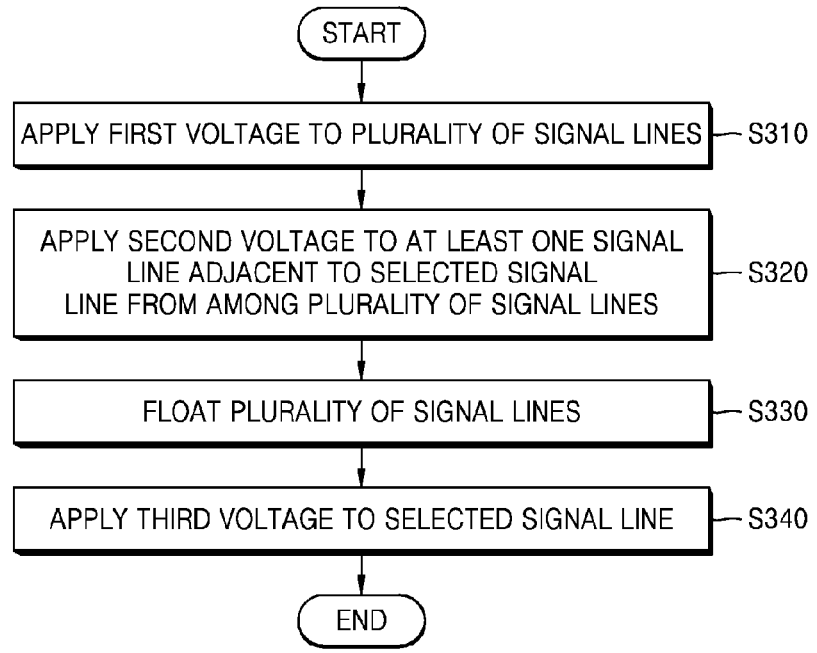
FIG. 16 is a flowchart of a method of operating a memory device, according to an embodiment of the inventive concept.

FIG. 16 is a flowchart of a method of operating a memory device, according to an embodiment of the inventive concept. The above descriptions with reference to FIGS. 1 through 13 may be applied to the method of operating a memory device, according to the present embodiment.

Referring to FIG. 16, a first voltage is applied to multiple signal lines (S310). The signal lines include selected signal lines connected to the selected memory cell and unselected signal lines connected to unselected memory cells. The signal lines may be word lines or bit lines. The first voltage may be an inhibit voltage for preventing leakage current from flowing in the unselected memory cells. The selected signal lines may be precharged by the first voltage.

A second voltage is applied to at least one signal line adjacent to the selected signal line, from among the multiple signal lines (S320). The at least one signal line may be an adjacent unselected signal line that is adjacent to the selected signal line from among the unselected signal lines. The second voltage may be higher than or lower than the first voltage. The second voltage may be a compensated voltage of the first voltage, for example, the inhibit voltage, in order to compensate for coupling effect between the adjacent unselected signal line and the selected signal line.

After that, the signal lines are floated (S330). Here, all of the unselected signal lines and the selected signal line are floated. Alternatively, the signal lines other than the selected signal line may be floated.

A third voltage is applied to the selected signal line (S340). The third voltage is an operating voltage for performing a writing or reading operation. For example, the third voltage may be the set writing voltage, the reset writing voltage, or the ground voltage. Data may be programmed in the selected memory cell or data stored in the selected memory cell may be read. A writing current or a reading current may flow in the selected memory cell. Here, the voltage levels of the inhibit voltage are maintained on the unselected memory cells, and thus, the leakage current in the unselected memory cells is reduced.

Figure 17A:
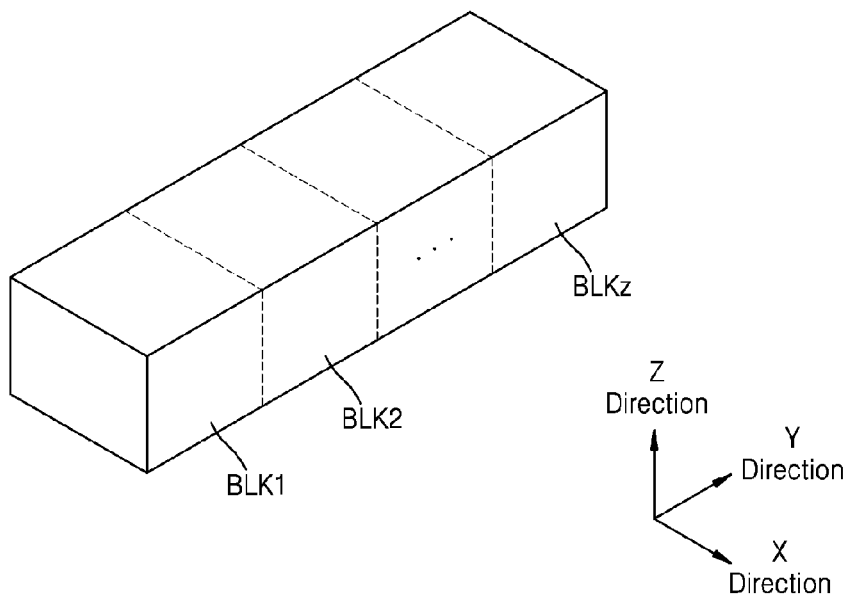
FIGS. 17A and 17B are a block diagram and a circuit diagram of the memory cell array of FIG. 1.
Figure 17B:
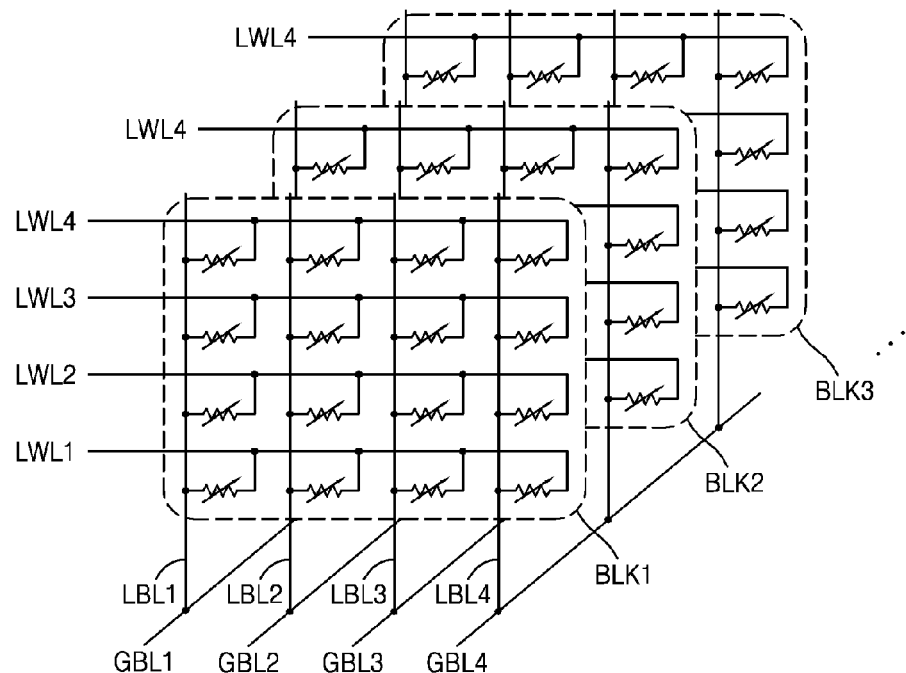

FIG. 17A is a block diagram and FIG. 17B is a circuit diagram showing an example of the memory cell array 110 shown in FIG. 1.

Referring to FIGS. 17A and 17B, the memory cell array 110 includes multiple memory blocks BLK1 through BLKz. Each of the memory blocks BLK1 through BLKz has a three-dimensional (or a vertical structure). Also, each memory block includes multiple memory layers extending in a direction that is perpendicular to a substrate.

Cell strings of one memory block are connected to multiple bit lines, multiple string selection lines, and multiple word lines. The cell strings of the memory blocks BLK1 through BLKz may share multiple bit lines BL.

The memory blocks BLK1 through BLKz may be selected by the row decoder 150 and/or the column decoder 160 shown in FIG. 2. For example, the row decoder 150 may be configured to select, among the memory blocks BLK1 through BLKz, a memory block connected to a word line that corresponds to the row address X_ADDR. In the memory device 100, an erase operation may be performed by units of memory blocks, and in order to perform the erase operation on a memory block, a reset pulse may be applied to the memory block.

FIG. 17B illustrates an example in which the memory blocks BLK1 through BLKz of FIG. 17A are embodied. For convenience of description, FIG. 17B does not illustrate a selection device that may be embodied as a diode or a transistor, as discussed above.

Referring to FIG. 17B, the memory cell array 110 includes the memory blocks BLK1 through BLKz that are three-dimensionally stacked. Each of the memory blocks BLK1 through BLKz may include multiple memory layers. Also, the memory cell array 110 includes multiple local bit lines LBL1 through LBL4 that extend parallel to a Z-axis direction, and multiple local word lines LWL1 through LWL4 that extend parallel to a Y-axis direction that is perpendicular to the Z-axis direction. Also, the local bit lines LBL1 through LBL4 are connected to global bit lines GBL1 through GBL4.

Referring to the first memory block BLK1, memory cells of the memory cell array 110 are connected between the local word lines LWL1 through LWL4 and the local bit lines LBL1 through LBL4. A writing operation or a reading operation may be performed on the memory cells by a current (or a voltage) that is applied to the local word lines LWL1 through LWL4 and/or the local bit lines LBL1 through LBL.

In the present embodiment, the memory layers share the local bit lines LBL1 through LBL4 and the local word lines LWL1 through LWL4 with other adjacent memory layers. To an unselected local bit line that is adjacent to a selected local bit line from among the multiple local bit lines LBL1 through LBL4, an inhibit voltage that is different from the other inhibit voltages applied to other local bit lines, for example, a compensated inhibit voltage, may be applied. Here, the unselected local bit line adjacent to the selected local bit line may include an unselected local bit line that is adjacent to the selected local bit line in an X-axis direction and a Y-axis direction.

Figure 18:
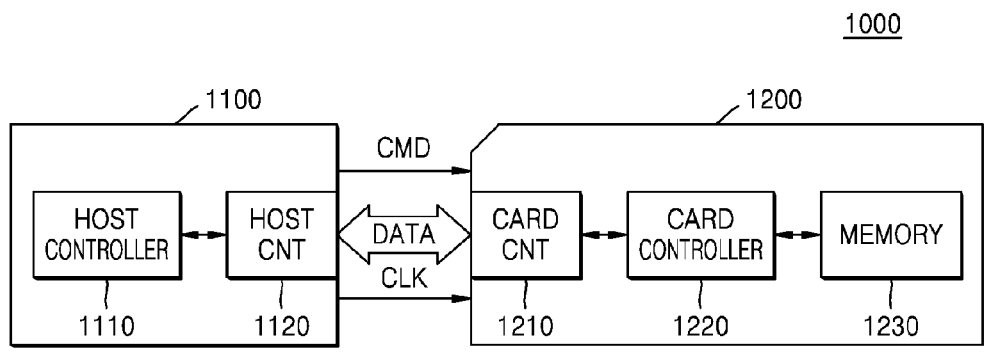
FIG. 18 is a block diagram of a memory card system to which a memory device is applied, according to an embodiment of the inventive concept.

FIG. 18 is a block diagram of a memory card system 1000 having a memory system applied thereto, according to an embodiment of the inventive concept.

Referring to FIG. 18, the memory card system 1000 includes a host 1100 and a memory card 1200. The host 1100 includes a host controller 1110 and a host connector 1120. The memory card 1200 includes a card connector 1210, a card controller 1220, and a memory device 1230. Here, the memory card 1200 may be implemented according to embodiments discussed above with reference to FIGS. 1 through 17B.

The host 1100 may write data in the memory card 1200 or read data stored in the memory card 1200. The host controller 1110 may transmit a command CMD, a clock signal CLK generated in a clock generator (not shown) in the host 1100, and the data DATA to the memory card 1200 via the host connector 1120.

In response to the command CMD received via the card connector 1210, the card controller 1220 may store the data DATA in the memory device 1230, in synchronization with a clock signal generated by a clock generator (not shown) in the card controller 1220. The memory device 1230 may store the data DATA that is transmitted from the host 1100.

The memory card 1200 may be realized as a compact flash card (CFC), a micro drive, a smart media card (SMC), a multimedia card (MMC), a security digital card (SDC), a memory stick, or a USB flash memory, for example.

Figure 19:
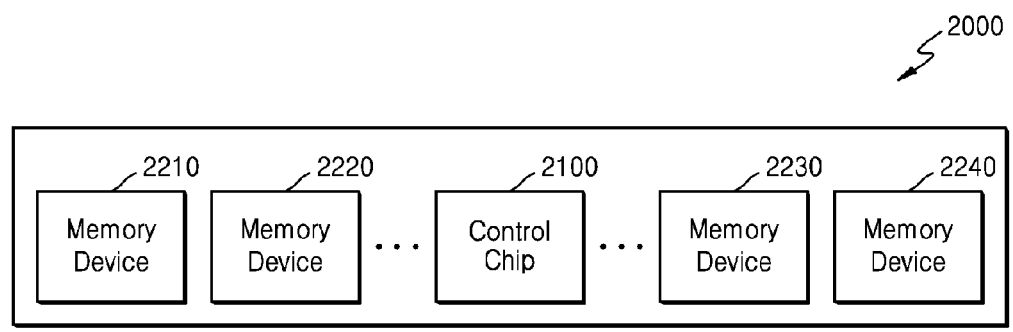
FIG. 19 is a diagram of a resistive memory module, according to an embodiment of the inventive concept.

FIG. 19 is a block diagram of a resistive memory module 2000, according to an embodiment of the inventive concept. Referring to FIG. 19, the resistive memory module 2000 includes memory devices 2210, 2220, 2230 and 2240 (collectively referred to as memory devices 2210 through 2240), and a control chip 2100. One or more of the memory devices 2210 through 2240 may be implemented according to embodiments discussed above with reference to FIGS. 1 through 17B. The control chip 2100 may control the memory devices 2210 through 2240 in response to various signals transmitted from an external memory controller. For example, the control chip 2100 may activate the memory devices 2210 through 2240 corresponding to various commands and addresses transmitted from the outside in order to control writing and reading operations. Also, the control chip 2100 may perform post processing of the read data output from the memory devices 2210 through 2240, such as error detection and correction operations of the read data, for example.

According to the various embodiments of the inventive concept, when the writing or reading operation is performed on the memory cell array included in each of the memory devices 2210 through 2240, the inhibit voltage is applied to some of the unselected signal lines that are connected to unselected memory cells and the compensated inhibit voltage that is higher or lower than the inhibit voltage is applied to some other unselected signal lines. The unselected signal lines, to which the compensated inhibit voltage is applied, may be adjacent unselected signal lines that are adjacent to the selected signal line connected to the selected memory cell. After that, when the unselected signal lines are floated and the set writing voltage, the reset writing voltage, the reading voltage, or the ground voltage is applied to the selected signal line, the adjacent unselected signal lines are coupled to the selected signal line, and thus, voltages of the adjacent unselected signal lines may change to be substantially the same as the voltage as the inhibit voltage.

Figure 20:
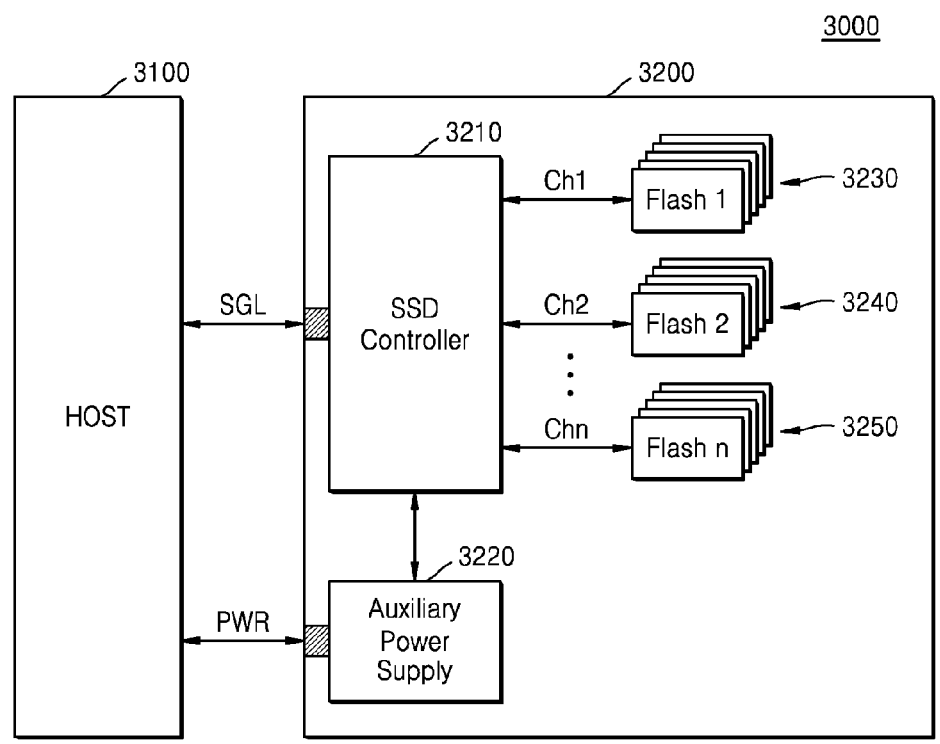
FIG. 20 is a block diagram of an SSD system to which a memory system is applied, according to the embodiment of the inventive concept.

FIG. 20 is a block diagram of an example in which a memory system, according to an embodiment of the inventive concept, is applied to an SSD system 3000.

Referring to FIG. 20, the SSD system 3000 includes a host 3100 and an SSD 3200. The SSD 3200 exchanges signals with the host 3100 via a signal connector and receives a power input from a power connector. The SSD 3200 include an SSD controller 3210, an auxiliary power device 3220, and multiple memory devices 3230, 3240, and 3250. Here, the SSD 3200 implemented according to the embodiments discussed above with reference to FIGS. 1 through 17B.

Figure 21:
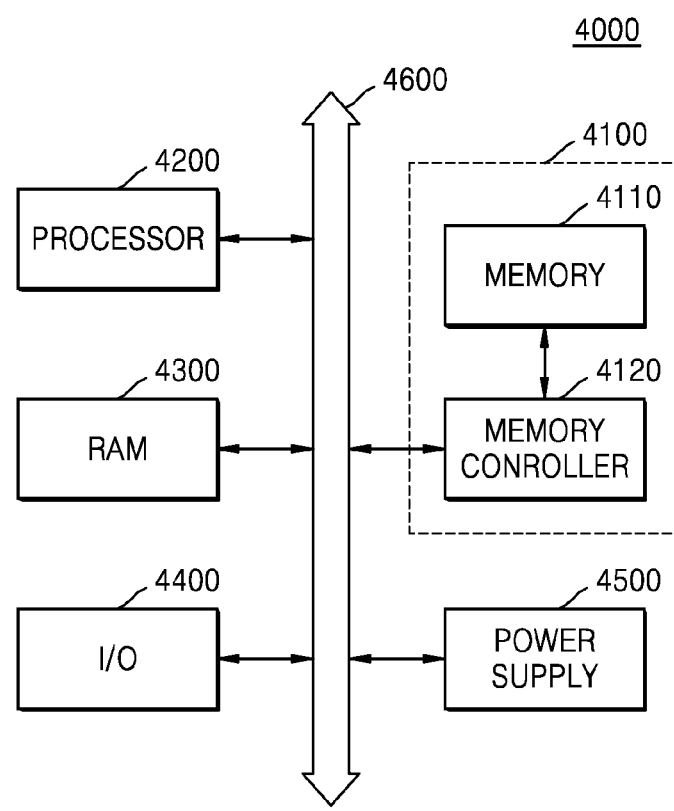
FIG. 21 is a block diagram of a computing system including a memory system, according to the embodiment of the inventive concept.

FIG. 21 is a block diagram of a computing system 4000 including a memory system, according to an embodiment of the inventive concept.

Referring to FIG. 21, the computing system 4000 includes a memory system 4100, a processor 4200, RAM 4300, an input/output (I/O) device 4400, and a power supply device 4500. Although not shown in FIG. 21, the computing system 4000 may further include ports capable of communicating with a video card, a sound card, a memory card, a USB device, and/or other electronic devices. The computing system 4000 may be embodied as a personal computer (PC), or a portable electronic device, such as a notebook computer, a mobile phone, a personal digital assistant (PDA), or a camera, for example.

The processor 4200 performs particular calculations or tasks. In various embodiments, the processor 4200 may be a micro-processor, a Central Processing Unit (CPU), or the like. The processor 4200 may perform communication with the RAM 4300, the I/O device 4400, and the memory system 4100 via a bus 4600 such as an address bus, a control bus, or a data bus. Here, the memory system 4100 may be implemented according to the embodiments described above with reference to FIGS. 1 through 17B.

In various embodiments, the processor 4200 may also be connected to an extended bus, such as a Peripheral Component Interconnect (PCI) bus, for example.

The RAM 4300 may store data for operations of the computing system 4000. As described above, the memory device according to the various embodiments of the inventive concept may be applied to the RAM 4300. Alternatively, the RAM 4300 may include DRAM, mobile DRAM, SRAM, PRAM, FRAM, or MRAM, for example.

The I/O device 4400 may include an input unit, such as a keyboard, a keypad, and/or a mouse, and an output unit, such as a printer or a display, for example. The power supply device 4500 may supply an operating voltage for the operations of the computing system 4000.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A method of operating a resistive memory device comprising a plurality of memory cells arranged in regions where a plurality of first signal lines and a plurality of second signal lines cross each other, the method comprising:
    applying a first voltage to a first line, from among unselected first signal lines connected to unselected memory cells, that is not adjacent to a selected first signal line connected to a selected memory cell from among the plurality of memory cells;
    applying a second voltage that is lower than the first voltage to a second line, from among the unselected first signal lines, that is adjacent to the selected first signal line;
    floating the unselected first signal lines; and
    applying a third voltage that is higher than the first voltage to the selected first signal line.

2. The method of claim 1, wherein, when the third voltage is applied to the selected first signal line, a voltage level of the second line from among the unselected first signal lines changes from the second voltage to the first voltage.

3. The method of claim 1, wherein a voltage difference between the first voltage and the second voltage is determined based on a voltage difference between the first voltage and the third voltage.

4. The method of claim 1, wherein a voltage difference between the first voltage and the second voltage is set according to a kind of operation performed by the memory device.

5. The method of claim 1, wherein the third voltage is one of a reset writing voltage, a set writing voltage, and a reading voltage.

6. The method of claim 1, wherein floating the unselected first signal lines comprises:
   floating the first line after applying the first voltage to the first line; and
   floating the second line after applying the second voltage to the second line.

7. The method of claim 1, wherein a time period of applying the first voltage at least partially overlaps with a time period of applying the second voltage.

8. The method of claim 1, further comprising:
   applying a fourth voltage that is equal to or higher than the first voltage to a first line, from among unselected second signal lines that are connected to the unselected memory cells, that is not adjacent to a selected second signal line connected to the selected memory cell;
   applying a fifth voltage that is higher than the fourth voltage to a second line, from among the unselected second signal lines, that is adjacent to the selected second signal line;
   floating the unselected second signal lines; and
   applying a sixth voltage that is lower than the fourth voltage to the selected second signal line.

9. The method of claim 8, wherein the sixth voltage is substantially the same as a ground voltage.

10. The method of claim 1, wherein the resistive memory device comprises a plurality of memory layers stacked in a first direction,
   wherein each of the plurality of memory layers comprises the plurality of memory cells arranged between the plurality of first signal lines arranged in a second direction that is perpendicular to the first direction and the plurality of second signal lines arranged in a third direction that is perpendicular to the first and second directions, and
   wherein the second line from among the unselected first signal lines comprises at least one unselected first signal line adjacent to the selected first signal line in the first and second directions.

11. The method of claim 10, wherein each of the plurality of memory layers shares the first signal lines or the second signal lines with other adjacent memory layers.

12. A method of operating a resistive memory device comprising a plurality of memory cells, the method comprising:
   applying a first voltage to an unselected signal line that is not adjacent to a selected signal line;
   applying a second voltage having a different voltage level from a voltage level of the first voltage to a unselected signal line that is adjacent to the selected signal line; and
   applying a third voltage having a different voltage level from the voltage levels of the first voltage and the second voltage, respectively, to the selected signal line,
   wherein a voltage difference between the first voltage and the second voltage varies depending on an operation performed by the resistive memory device.

13. The method of claim 12, wherein a voltage difference between the first voltage and the second voltage is less than a voltage difference between the first voltage and the third voltage.

14. The method of claim 12, wherein the third voltage is one of a set writing voltage, a reset writing voltage, and a reading voltage, and the second voltage is lower than the first voltage.

15. The method of claim 12, wherein the third voltage is substantially the same as a ground voltage and the second voltage is higher than the first voltage.

16. A resistive memory device, comprising:
   a memory cell array comprising a plurality of memory cells arranged in regions where a plurality of first signal lines and a plurality of second signal lines cross each other;
   a voltage generator configured to generate a first voltage, a second voltage different from the first voltage, and a third voltage different from the first and second voltages; and
   control logic configured to select a memory cell from among the plurality of memory cells, the selected memory cell being connected to a selected first signal line and a selected second signal line; to apply the first voltage to a first line, from among unselected first signal lines connected to unselected memory cells, that is not adjacent to the selected first signal line; to apply the second voltage to a second line, from among the unselected first signal lines, that is adjacent to the selected first signal line; and to apply the third voltage to the selected first signal line as the first and second lines are floated.

17. The resistive memory device of claim 16, wherein the third voltage is higher than the first voltage, and the second voltage is lower than the first voltage for minimizing leakage current flowing in an unselected memory cell connected to the second line.

18. The resistive memory device of claim 16, wherein the third voltage is lower than the first voltage, and the second voltage is higher than the first voltage for minimizing leakage current flowing in an unselected memory cell connected to the second line.

19. The resistive memory device of claim 16, wherein the voltage generator is further configured to generate a fourth voltage, a fifth voltage different from the fourth voltage, and a sixth voltage different from the fourth and fifth voltages, and
   wherein the control logic is further configured to apply the fourth voltage to a first line, from among unselected second signal lines connected to the unselected memory cells, that is not adjacent to the selected second signal line; to apply the fifth voltage to a second line, from among the unselected second signal lines, that is adjacent to the selected second signal line; and to apply the sixth voltage to the selected second signal line as the first and second lines are floated.

20. The resistive memory device of claim 19, wherein the fourth voltage is equal to or higher than the first voltage, and the fifth voltage is higher than the fourth voltage, and the sixth voltage is lower than the fourth voltage.

* * * * *